(12) United States Patent
Loy et al.

(10) Patent No.: US 12,243,840 B2
(45) Date of Patent: Mar. 4, 2025

(54) WIREBONDABLE INTERPOSER FOR FLIP CHIP PACKAGED INTEGRATED CIRCUIT DIE

(71) Applicant: Samtec, Inc., New Albany, IN (US)

(72) Inventors: Edwin Loy, Fremont, CA (US); Yan Yang Zhao, Fremont, CA (US); Chihhao Chen, Fremont, CA (US)

(73) Assignee: SAMTEC, INC., New Albany, IN (US)

( * ) Notice: Subject to any disclaimer, the term of this patent is extended or adjusted under 35 U.S.C. 154(b) by 0 days.

(21) Appl. No.: 16/937,922

(22) Filed: Jul. 24, 2020

(65) Prior Publication Data

US 2021/0028140 A1    Jan. 28, 2021

Related U.S. Application Data

(60) Provisional application No. 62/878,466, filed on Jul. 25, 2019.

(51) Int. Cl.
*H01L 21/48* (2006.01)
*H01L 21/50* (2006.01)
(Continued)

(52) U.S. Cl.
CPC .......... *H01L 24/14* (2013.01); *H01L 21/4853* (2013.01); *H01L 21/4857* (2013.01); *H01L 21/50* (2013.01); *H01L 23/49811* (2013.01); *H01L 23/49822* (2013.01); *H01L 23/4985* (2013.01); *H01L 23/5384* (2013.01);
(Continued)

(58) Field of Classification Search
CPC .............. H01L 2224/1624; H01L 2224/16111; H01L 2224/16112; H01L 2224/16147; H01L 2224/16237; H01L 2224/16151; H01L 2224/16221; H01L 2224/16225; H01L 2224/48227; H01L 2224/73265; H01L 2224/48247; H01L 2224/73215; H01L 2225/0651; H01L 23/49811; H01L 2225/06506; H01L 2924/19107; H01L 2224/48157; H01L 2224/48235; H01L 24/85; H01L 24/97; H01L 2224/97
See application file for complete search history.

(56) References Cited

U.S. PATENT DOCUMENTS

| | | |
|---|---|---|
| 6,180,265 B1 | 1/2001 | Erickson |
| 6,667,556 B2 | 12/2003 | Moden |
| 6,853,058 B2 | 2/2005 | Cobbley |
| 8,187,922 B2 | 5/2012 | Aboush et al. |
| 2003/0062629 A1 | 4/2003 | Moden |
| 2005/0029666 A1* | 2/2005 | Kurihara ............ H01L 24/85 |
| | | 257/772 |
| 2005/0116354 A1 | 6/2005 | Kashiwazaki |
| 2007/0181990 A1* | 8/2007 | Huang ............... H01L 21/565 |
| | | 438/109 |

(Continued)

FOREIGN PATENT DOCUMENTS

| | | |
|---|---|---|
| KR | 10-2010-0054602 A | 5/2010 |
| KR | 10-1202452 B1 | 11/2012 |
| WO | 2018/120060 A1 | 7/2018 |

*Primary Examiner* — Nicholas J Tobergte
*Assistant Examiner* — William Henry Anderson
(74) *Attorney, Agent, or Firm* — BakerHostetler

(57) ABSTRACT

A variety of methods and arrangements to convert a flip chip IC die package into a wirebondable component using an interposer are described. The interposer has an insulating layer and a patterned metal layer attached to one side of the insulating layer. The patterned metal layer is electrically connected to the IC die using solder bumps. The interposer has wirebond pads on a side of the interposer opposed to the side of the interposer having the electrical connection between the IC die and solder bumps. The interposer may be a thin organic laminate or a flexible printed circuit board.

23 Claims, 10 Drawing Sheets

(51) Int. Cl.
*H01L 23/00* (2006.01)
*H01L 23/498* (2006.01)
*H01L 23/538* (2006.01)
*H04B 10/80* (2013.01)
*H04B 10/40* (2013.01)

(52) U.S. Cl.
CPC ...... *H01L 23/5385* (2013.01); *H01L 23/5387* (2013.01); *H01L 24/16* (2013.01); *H01L 24/81* (2013.01); *H01L 24/05* (2013.01); *H01L 24/32* (2013.01); *H01L 24/73* (2013.01); *H01L 2224/0401* (2013.01); *H01L 2224/05076* (2013.01); *H01L 2224/05078* (2013.01); *H01L 2224/05082* (2013.01); *H01L 2224/05557* (2013.01); *H01L 2224/16227* (2013.01); *H01L 2224/32225* (2013.01); *H01L 2224/73204* (2013.01); *H01L 2224/81815* (2013.01); *H04B 10/40* (2013.01); *H04B 10/808* (2013.01)

(56) References Cited

U.S. PATENT DOCUMENTS

| | | | |
|---|---|---|---|
| 2007/0202682 A1* | 8/2007 | Yamamoto | H05K 3/241 438/612 |
| 2008/0315372 A1* | 12/2008 | Kuan | H01L 21/78 257/659 |
| 2010/0213589 A1* | 8/2010 | Hsieh | H01L 23/49531 257/676 |
| 2014/0048951 A1 | 2/2014 | Wang et al. | |
| 2014/0124910 A1* | 5/2014 | Lee | H01L 21/486 257/668 |
| 2016/0274316 A1* | 9/2016 | Verdiell | G02B 6/428 |
| 2016/0284631 A1 | 9/2016 | Cabahug et al. | |
| 2017/0133353 A1* | 5/2017 | Lin | H01L 24/49 |
| 2017/0207200 A1* | 7/2017 | Lin | H01L 21/561 |
| 2018/0005919 A1* | 1/2018 | Chen | H01L 21/565 |
| 2018/0158770 A1* | 6/2018 | Lin | H01L 25/105 |
| 2018/0190622 A1* | 7/2018 | Lin | H01L 23/4952 |
| 2020/0006290 A1* | 1/2020 | Chang Chien | H01L 25/50 |

\* cited by examiner

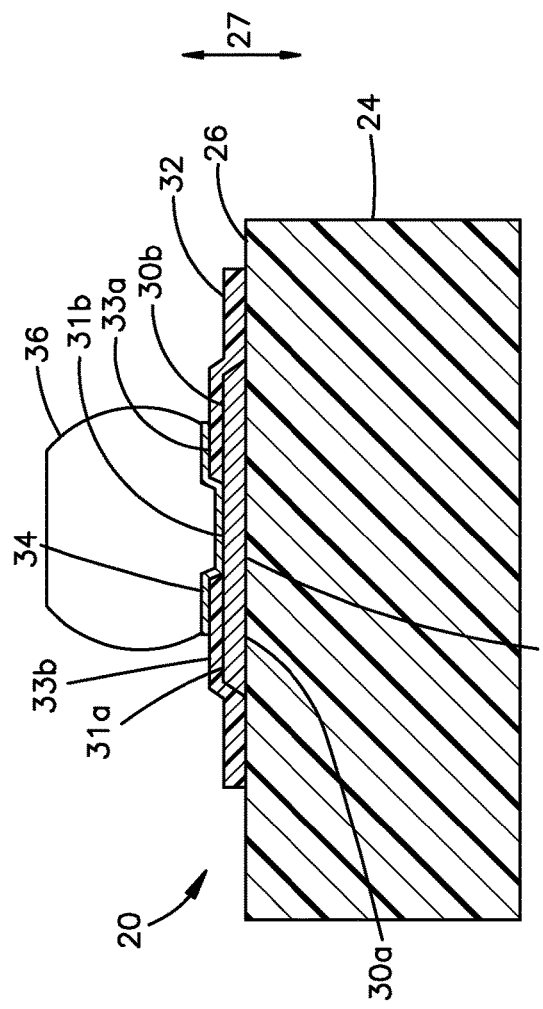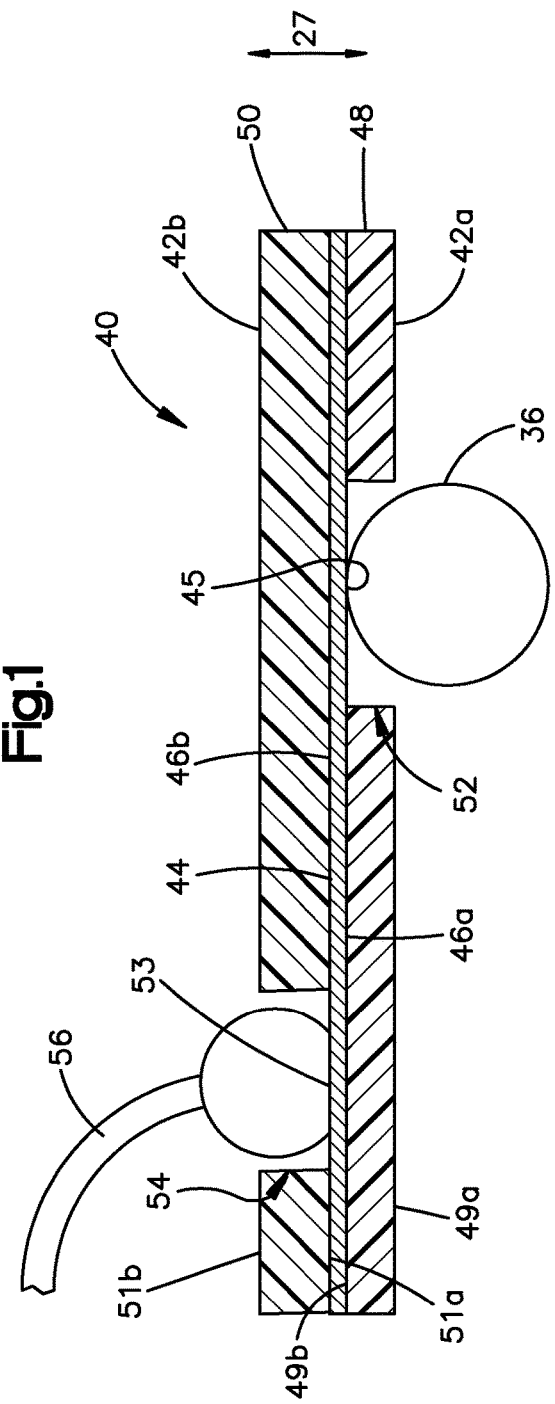

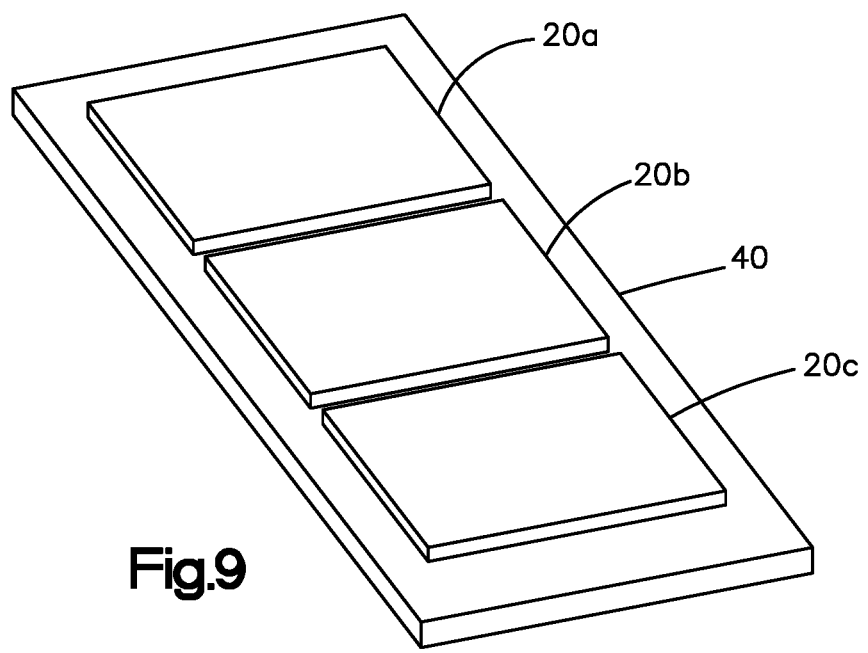

WIREBONDABLE INTERPOSER FOR FLIP CHIP PACKAGED INTEGRATED CIRCUIT DIE

CROSS-REFERENCE TO RELATED APPLICATIONS

This claims priority to U.S. Patent Application Ser. No. 62/878,466 filed Jul. 25, 2019, the disclosure of which is hereby incorporated by reference as if set forth in its entirety herein.

BACKGROUND

There are two basic types of integrated circuit (IC) dies, a flip chip IC die and a wirebondable IC die, that are configured to establish an electrical connection with an external substrate. The flip chip IC die includes a die substrate and active circuitry fabricated on an outer surface of the die substrate. To mount the flip chip IC die to the external substrate, the outer surface of the flip chip IC die faces a surface of the external substrate, such that electrical contact pads of the IC die align with electrical contact pads of the external substrate to form respective pad pairs. Electrical connections between the pad pairs are made using solder bumps, copper pillars, stud bumps, or some other type of electrical attachment method. The wirebondable IC die includes a die substrate and active circuitry including electrical contact pads supported by an outer surface of the die substrate. To mount the wirebondable IC die to the external substrate, the outer surface of the wirebondable IC die faces away from a surface of the external substrate. Electrical contact pads on the external substrate are distributed outside of the footprint of the IC die. Accordingly, the electrical contact pads of the external substrate and electrical contact pads of the IC die are both exposed and may form pad pairs. The electrical contact pads of the IC die and the electrical contact pads on the external substrate are suitable for wire or ribbon bonding (collectively referred to herein as wirebonding). Thus, wire bonds may establish an electrical connection between pad pairs formed by the electrical contact pads of the IC die and the electrical contact pads of the external substrate.

Some integrated circuit dies are available in both wirebondable and flip chip configurations, while other IC dies are available in only one configuration. Generally, a wirebondable IC die is not compatible with flip chip mounting and vice versa. In particular, the contact pad material of a flip chip IC die, while configured to bond with the solder bumps or copper pillars, is not as suitable to the wire bonding. Further, when the electrical contact pads on conventional external substrates have a layout configured to be wirebonded to the die, the electrical contact pads are incompatible with the flip chip IC die. In particular, when the respective surfaces of the flip chip die package and the wirebondable external substrate face each other, the respective contact pads do not overlap with each other along a transverse direction perpendicular to mating faces of the IC die and external substrate. This is because the contact pads of the wirebondable substrate are disposed outside the footprint of the die, such that the contact pads of the substrate are exposed for wirebonding when the die is mounted on the substrate. Further, it is time consuming and expensive to redesign a flip chip die to be a wirebondable die. It is therefore desirable to allow a flip chip die to be mount to an external substrate configured to accept a wirebondable die.

SUMMARY

A variety of methods and arrangements to convert a flip chip IC die to a wirebondable component are described. In one example, a method of converting an IC die to a wirebondable electrical component includes the step of flip chip mounting the IC die to a first surface of at least one patterned electrically conductive layer of an interposer, wherein the interposer has wirebond pads at a second surface of the at least one electrically conductive layer that is opposite the first surface.

BRIEF DESCRIPTION OF DRAWINGS

The following detailed description will be better understood when read in conjunction with the appended drawings, in which there is shown in the drawings example embodiments for the purposes of illustration. It should be understood, however, that the present disclosure is not limited to the precise arrangements and instrumentalities shown. In the drawings:

FIG. 1 is a cross-sectional view of a portion of a flip chip IC die;

FIG. 2 is a cross-sectional view of a portion of a wirebondable interposer having a flip chip side configured to be mounted to the flip chip IC die of FIG. 1, and an opposed wirebondable side that is configured for wirebonding;

FIG. 9 is a perspective view of an IC assembly including an interposer mounted to a plurality of IC die;

DETAILED DESCRIPTION

Figure 3:
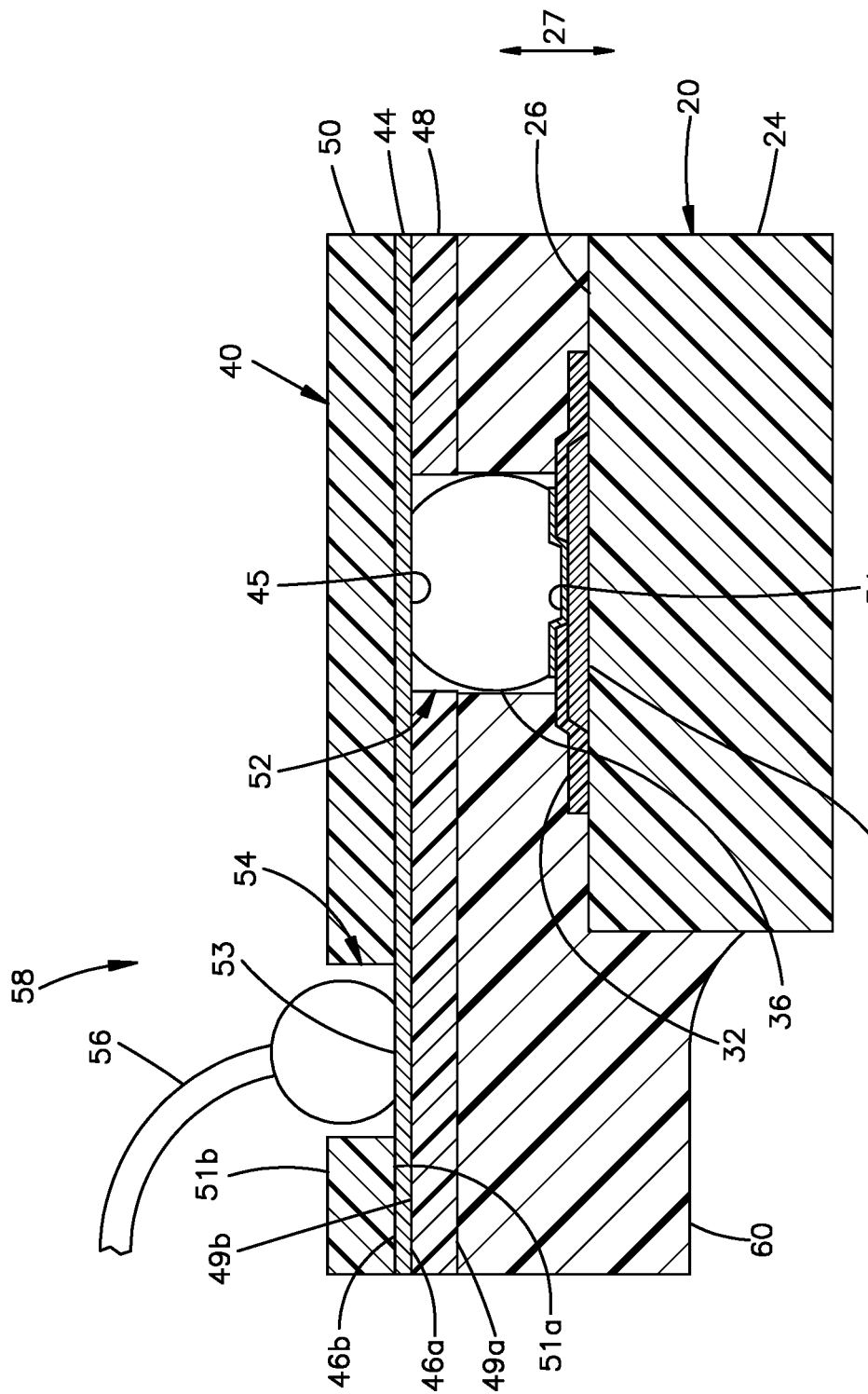
FIG. 3 is a cross-sectional view of a wirebondable IC assembly including the wirebondable interposer of FIG. 2 mounted to the flip chip IC die of FIG. 1.

The present disclosure is directed to a method and apparatus for placing an IC die in electrical communication with an external substrate wherein the IC die is configured for flip chip mounting, and the external substrate is configured for wirebonding. Accordingly, external substrates and circuit board layouts that are designed to be wirebonded to respective IC dies can be placed in electrical communication with IC dies that are configured for flip chip mounting and not for wirebond mounting.

As used herein, the singular forms "a," "an," and "the" include "at least one" and a plurality unless otherwise indicated. Further, reference to a plurality as used in the specification including the appended claims includes the singular "a," "an," "one," and "the," and further includes "at least one" unless otherwise indicated. Further still, reference to a particular numerical value in the specification including the appended claims includes at least that particular value, unless the context clearly dictates otherwise.

The term "plurality", as used herein, means more than one. When a range of values is expressed, another example includes from the one particular value and/or to the other particular value. Similarly, when values are expressed as approximations, by use of the antecedent "substantially," "approximately," "about," and derivatives thereof, it will be understood that the particular value forms another example. All ranges are inclusive and combinable.

Referring now to FIG. 1, an IC die 20 in one example is configured to be flip chip mounted to an external substrate. The IC die 20 includes a die substrate 24 having an outer active surface 26 with electrical components formed therein comprising active circuitry. The die substrate 24 is typically made of silicon, though the die substrate 24 can be made from any suitable alternative semiconductor material, such as germanium, gallium arsenide, indium phosphide or other III-V or II-VI semiconductor materials. The outer active surface 26 can include one or more metallization layers disposed over a contact layer that is in electrical communication with the electrical components of the IC die 20. Thus, in one example, the outer active surface 26 can include an electrically conductive contact layer 30 that is supported by the outer active surface 26. In some examples, the contact layer 30 is disposed on the outer active surface 26. In other examples, the contact layer 30 is disposed on at least one intermediate layer that, in turn, is disposed on the outer active surface 26. The contact layer 30 can be any suitable metal, such as aluminum, copper, nickel, tungsten, palladium, gold, or the like. The contact layer 30 defines an inner surface 30a that can face the outer active surface 26, and an outer surface 30b opposite the inner surface 30a along a transverse direction 27. The outer active surface 26 can face away from the external substrate.

The outer active surface 26 can include a passivation layer 32 that extends along the outer surface 26 and further covers a portion of the outer surface 30b of the contact layer 30. For instance, the passivation layer 32 can cover an outer perimeter of the outer surface 30b. Thus, the outer surface 30b can define a covered region 31a that is covered by the passivation layer 32, and an uncovered region 31b that is not covered by the passivation layer 32. The covered region 31a can surround the uncovered region 31b in some examples. The outer active surface 26 can further include an under bump metallization (UBM) layer 34 or other electrically conductive layer that is in electrical communication with the contact layer 30. In one example, the UBM layer 34 can extend along and contact the uncovered region 31b of the outer surface 30b. Further, the UBM layer 34 can include an overlap region that extends along a portion of the passivation layer 32. For instance, the overlap region of the UBM layer 34 can extend along a portion of the passivation layer 32 that extends along the covered region 31a of the outer surface 30b. Thus, the passivation layer 32 defines a covered region 33a that is covered by the UBM layer 34, and an exposed region 33b adjacent the covered region 33a and not covered by the UBM layer 34.

The IC die 20 can further include an electrically conductive interface 36 that makes electrical contact with the active circuitry and provides a path for electrical signals to enter and exit the IC die 20. For instance, the electrically conductive interface 36 can be mounted to the UBM layer 34, and can further be mounted to an electrical contact pad of an external component that can be configured as an interposer 40 (see FIG. 2) so as to flip chip mount the IC die 20 to the interposer 40. The electrically conductive interface 36 can be configured as a mass of solder, stud bump, or copper pillar, or any suitable alternative material and structure. Typically, the mass of solder can be constructed as a solder bump. In one example, the solder bump can be configured as a solder ball having a generally spherical shape, though the solder bump can define any suitable shape as desired. The solder bump can have a diameter or other maximum cross-sectional dimension that is in a range from approximately 30 microns to approximately 80 microns, such as approximately 40 microns. It should be appreciated, of course, that the solder bump can define any suitable size and shape as desired. In another example, the electrically conductive interface 36 can be made from copper and can be constructed generally in the shape of a pillar. The UBM layer 34 can thus be made of a material that is configured to bond with the electrically conductive interface 36, such as aluminum or copper or the like.

The term "substantially," "approximately," "about," and derivatives thereof, and words of similar import, when used to described sizes, shapes, spatial relationships, distances, directions, and other similar parameters includes the stated parameter in addition to a range up to 10% more and up to 10% less than the stated parameter, including up to 5% more and up to 5% less, including up to 3% more and up to 3% less, including up to 1% more and up to 1% less.

The IC die 20 can include a plurality of contact layers 30, and the passivation layer 32 can cover respective portions of the contact layers 30 in the manner described herein. Alternatively, a plurality of passivation layers 32 can cover a portion of respective ones of the contact layers 30. Further, a plurality of UBM layers 34 can extend over respective ones of the contact layers 30 in the manner described above. The IC die 20 can include a plurality of electrically conductive interfaces 36 that are placed onto and eventually bonded to the UBM layers 34 in the manner described herein. The electrically conductive interfaces 36 can define a grid array of solder bumps (which can be referred to as a ball grid array (or BGA) when the solder bumps are configured as solder balls) along the outer active surface 26 of the IC die substrate 24 that can define a mounting interface of the IC die substrate 24. The electrically conductive interfaces 36 can be spaced from each other at a fine pitch. For instance, adjacent ones of the electrically conductive interfaces 36 can be spaced from each other at a pitch of less than 300 microns, though it is appreciated that electrically conductive interfaces 36 of any suitable pitch or size can be used.

In some examples, at least one IC die 20 can be integrated into an optical transceiver. The IC die 20 can define a laser diode driver for a VCSEL (vertical cavity surface emitting laser) array of the transceiver. Alternatively, the IC die 20 can define a transimpedance amplifier (TIA) designed to receive and condition electrical signals from a high speed photodetector array. The IC die 20 is not intended to be limited to this application, and the present disclosure is applicable to any flip chip packaged IC die, unless otherwise indicated. The IC die 20 may be singulated, that is the IC die 20 has been separated from a wafer containing a plurality of IC dies in a previous processing step.

As described above, the IC die 20 can be configured to be placed in electrical communication with an external component, such as an external substrate that can be configured as a printed circuit board, via a wirebond. Otherwise stated, an IC assembly including the IC die 20 can be configured for wirebonding. As illustrated in FIG. 2, the IC assembly can further include an interposer 40, whereby the IC die 20 (see FIG. 1) can be flip chip mounted to the interposer 40. As will be appreciated from the description below, the interposer 40 can be double access, that is electrical connections may be made to the two opposed major surfaces or sides of the interposer 40. A first side 42a of the interposer 40 can be configured to be flip chip mounted to the IC die 20, and a second side 42b of the interposer 40 opposite the first side 42a along the transverse direction 27 can be configured to be wirebonded to an external component, such as an external substrate.

In particular, with continuing reference to FIG. 2, the interposer 40 can include an electrically conductive layer 44 that defines a first or inner surface 46a and a second or outer surface 46b opposite the first surface 46a along the transverse direction 27. The first surface 46a faces the first side 42a of the interposer 40, and the second surface 46b faces the second side 42b. Thus, the first side 42a is configured to face the flip chip IC die 20 (see FIG. 3). The interposer 40 has a thickness from the first surface 46a to the second surface 46b. The thickness can be substantially equal to or less than approximately 200 microns. The electrically conductive layer 44 can be any suitable material, such as a metal. The metal can be copper or any suitable alternative material as desired. Further, the metal can include an electrically conductive coating on one or both sides of the copper or other metal. The electrically conductive layer 44 can have a thickness from the first surface 46a to the second surface 46b that is in a range of approximately 1 micron to approximately 25 microns. It should be appreciated, of course, that the electrically conductive layer 44 can have any suitable alternative thickness as desired.

The electrically conductive layer 44 can be patterned so as to form a plurality of electrically conductive paths that are electrically insulated from each other. For instance, the interposer 40 can further include a first electrically insulative layer 48 and a second electrically insulative layer 50, such that the electrically conductive layer 44 is positioned between the first and second electrically insulative layers 48 and 50. In particular, the electrically conductive layer 44 can be attached to each of the first and second electrically insulative layers 48 and 50. In one example, one of the first and second electrically insulative layers 48 and 50 can be laminated with the electrically conductive layer 44. The electrically conductive layer 44 can be patterned and the unwanted material of the electrically conductive layer 44 can be etched away. The other of the first and second electrically insulative layers 48 and 50 can then be applied to the electrically conductive layer 44, such that the patterned electrically conductive layer 44 is disposed between the first and second electrically insulative layers 48 and 50, The interposer 40 may be a thin organic laminate or a flexible printed circuit. The first electrically insulative layer 48 can extend from the first surface 46a, or otherwise be disposed on the first surface 46a, of the electrically conductive layer 44. The second electrically insulative layer 50 can extend from the second surface 46b, or otherwise be disposed on the second surface 46b, of the electrically conductive layer 44. The first electrically insulative layer 48 defines a first or inner surface 49a that faces the IC die 20, and a second or outer surface 49b opposite the first surface 49a along the transverse direction 27. The second surface 49b faces the electrically conductive layer 44. In some examples, the second surface 49b can abut or attach to the first surface 46a of the electrically conductive layer 44. The second electrically insulative layer 50 defines a first or inner surface 51a that faces the electrically conductive layer 44, and a second or outer surface 51b opposite the first surface 51a along the transverse direction 27. In some examples, the first surface 51a can abut the second surface 46b of the electrically conductive layer 44.

The first electrically insulative layer 48 can be a polyimide or any suitable alternative electrically insulative material as desired. The second electrically insulative layer 50 can be a liquid photoimageable (LPI) solder mask or any suitable photomask material in one example, or any suitable alternative electrically insulative material as desired. In one example, the second electrically insulative layer 50 can be conformable to the metal layer 44 after the metal layer 44 has been patterned in the manner described above. Thus, at locations where material of the metal layer 44 has been etched, the first and second electrically insulative layers 48 and 50 can contact each other. The second electrically insulative layer 50 can define the outermost layer of the interposer 40 in some examples with respect to the transverse direction 27. Thus, the second surface 51b can define the outermost surface of the interposer 40 in some examples with respect to the transverse direction 27.

The first electrically insulative layer 48 defines a thickness from the first surface 49a to the second surface 49b along the transverse direction 27. and the second electrically insulative layer 50 can have a thickness range from approximately 0.1 micron to approximately 25 microns. In some examples, a chemical passivation layer can provide both an insulating layer and be used as a solder mask. Thus, either or both of the first and second electrically insulative layers 48 and 50 can be at least partially defined by a chemical passivation layer. In this case, the thickness of the insulating layer may be very thin, in the range of approximately 10 nm to 1 micron.

The first electrically insulative layer 48 can define at least one first hole 52 or a plurality of first holes that extends therethrough from the second surface 49b to the first surface 49a along the transverse direction 27. Thus, the first hole 52 extends through the first electrically insulative layer 48 to the electrically conductive layer 44, and in particular to an electrically conductive pad 45, which can be configured as a solder pad at the electrically conductive layer, which can thus either be disposed on the electrically conductive layer 44 or defined by the electrically conductive layer 44. As will be appreciated from the description below, the electrically conductive contact pad 45 is configured to be flip chip mounted to the IC substrate 24. The first hole 52 can therefore be referred to as a first through hole. The electrically conductive contact pad, or electrical contact pad 45, can be disposed at the first surface 46a of the electrically conductive layer 44. That is, the electrical contact pad can be disposed on the first surface 46a of the electrically conductive layer 44, or can be defined by the first surface 46a of the electrically conductive layer 44. The first hole 52 can have any suitable cross-sectional dimension as desired, such that the first hole 52 is sized to receive the electrically conductive interface 36, thereby establishing an electrical connection between the interposer 40, and in particular the electrically conductive layer 44, and the IC die 20 as will be described in more detail below. The first hole 52 can define a maximum cross-sectional dimension in a plane that is oriented perpendicular to the transverse direction 27, whereby the maximum cross-sectional dimension can be in a range from approximately 20 microns to approximately 150 microns, such as from approximately 30 microns to approximately 100 microns, and in one example can be approximately 60 microns. It should be appreciated, of course, that the maximum cross-sectional dimension can have any size as desired. In some examples, the first hole 52 can have a circular cross-section, such that the maximum cross-sectional dimension is a diameter.

The second electrically insulative layer 50 can define at least one second hole or a plurality of second holes 54 that extend therethrough from the second surface 51b to the first surface 51a along the transverse direction 27. The second holes 54 can be spaced in their entireties from the first holes 52 along a direction that is perpendicular to the transverse direction 27. In other examples, the second holes 54 can be at least partially or entirely aligned with the first holes 52 along the transverse direction 27. Thus, the second hole 54 extends through the second electrically insulative layer 50 to the electrically conductive layer 44. In particular, the second hole 54 can extend through the second electrically insulative layer to an electrically conductive wirebond pad 53 at the electrically conductive layer 44. The second hole 54 can thus be referred to as a second through hole. Thus, exposed portions of the electrically conductive layer 44, and in particular a plurality of electrically conductive wirebond pads 53, can be said to be exposed through a respective plurality of second holes 54 in the second electrically insulative layer 55. The electrically conductive wirebond pad 53 that can either be disposed on the electrically conductive layer 44 or defined by the electrically conductive layer 44. The electrically conductive wirebond pad 53 can be disposed at the second surface 46b of the electrically conductive layer 44. For instance, the wirebond pad 53 can be disposed on the second surface 46b or can be defined by the second surface 46b of the electrically conductive layer 44. The wirebond pads 53 are in electrical communication with respective ones of the electrical contact pads 45.

In this regard, it should be appreciated that the electrically conductive layer 44 can define a double access layer in that the electrically conductive interface 36 and the wirebond 56 can be mounted to opposite sides of the electrically conductive layer 44. Thus, the electrically conductive layer 44 can be electrically connected to both the electrically conductive interface 36 and the wirebond 56. The second hole 54 can have any suitable cross-sectional dimension as desired, such that the second hole 54 is sized to receive a wirebond 56, thereby establishing an electrical connection between the wirebond 56 and the interposer 40. The second hole 54 can define a maximum cross-sectional dimension in a plane that is oriented perpendicular to the transverse direction 27, whereby the maximum cross-sectional dimension can be in a range from approximately 20 microns to approximately 150 microns, such as from approximately 30 microns to approximately 100 microns, and in one example can be approximately 60 microns. It should be appreciated, of course, that the maximum cross-sectional dimension of the second hole 54 can have any size as desired. In some examples, the second hole 54 can have a circular cross-section, such that the maximum cross-sectional dimension is a diameter.

It is therefore appreciated that the first holes 52 and the second holes 54 can extend through the respective first and second electrically insulative layers 48 and 50, respectively, so as to expose the respective first and second surfaces of the at least one electrically conductive layer. The at least one electrically conductive layer can be defined by the single electrically conductive layer 44 or by first and second electrically conductive layers 62 and 64, respectively, as is described in more detail below.

The electrically conductive layer 44 is suitable for soldering or otherwise bonding to the electrically conductive interface 36 to the solder bump on its first side or surface 46a, and is further suitable for wirebonding on its second side or surface 46b. Thus, the electrically conductive layer 44 can be electrically connected to the IC die 20 through the electrically conductive interfaces 36. As such, the electrically conductive layer 44 can have different coatings or surface preparations on its first and second surfaces 46a and 46b, respectively. When the electrically conductive interface 36 and the wirebond 56 are mounted to the electrically conductive layer 44, the electrically conductive layer 44 places the wirebond 56 and the electrically conductive interface 36 in electrical communication with each other.

Because the electrically conductive layer 44 can bond with respective electrically conductive components (the interface 36 and the wirebond 56) at the first and second sides 46a and 46b, respectively, the interposer 40 can be referred to as having a double access metal layer. Thus, the interposer can place the interface 36 and the wirebond 56 in electrical communication with each other without the use of an electrically conductive through via that extends from the first side 42a to the second side 42b that places first and second opposed electrically conductive surfaces in electrical communication with each other. Thus, when the interface 36 and the wirebond 56 are mounted to the respective first and second surfaces, the via places the interface and the wirebond in electrical communication with each other. Though it is believed that avoiding such a via can improve high speed performance of the interposer, it is recognized, of course, that the interposer 40 can alternatively include such a via if desired. The interposer 40 can be configured to transfer data from the interface 36 to the wirebond 56 at high data transfer speeds up to approximately 56 Gbps, including approximately 28 Gbps.

Referring now to FIG. 3, a wirebondable IC assembly 58 that includes the IC die 20 and the interposer 40 electrically connected to the IC die 20. In particular, the interposer 40 can be mounted to the flip chip IC die 20. Thus, the wirebondable IC assembly 58 includes a flip chip IC die 20, and is configured to be wirebonded to an external component, such as an external substrate, so as to place the external component in electrical communication with the IC die 20. The interposer 40 can have one or more first holes 52 that extend through the first electrically insulative layer 48 in the manner described above. Each of the holes 52 can be configured to receive a respective electrically conductive interface 36 that is configured to bond to a corresponding IC die and the electrically conductive layer 44 of the interposer 40. That is, the first holes 52 and the exposed first electrical contact pads 45 of the electrically conductive layer 44 can be aligned with the respective UBM layer 34 of the IC die 20 along the transverse direction 27.

To establish electrical connections with the IC die 20, the interposer 40 can be positioned adjacent the UBM layer 34, and the electrically conductive interfaces 36 can be placed between the electrical contact pads 45 of the electrically conductive layer 44 and the UBM layer 34. The IC die 20, the interposer 40, and the electrically conductive interfaces 36 can then be placed into an oven, which raises the temperature of the electrically conductive interface 34 that causes the electrically conductive interface 36 to bond with the UBM layer 34 and the electrically conductive layer 44 of the interposer 40, thereby mounting the interposer 40 to the IC die 20 and establishing a permanent electrical and mechanical connection between the IC die 20 and the interposer 40. In particular, the electrically conductive layer 44 is placed in electrical communication with the UBM layer 34, and thus with the IC die substrate 24 through the contact layer 30. In one example, the electrically conductive interface 34 is a solder bump, and the oven is a solder reflow oven.

After the bonding step, an electrically insulative material such as a resin 60 can be placed in a gap that extends from the IC die 20 to the interposer 40, for instance along the transverse direction 27. The resin 60 can be an epoxy resin or any suitable alternative resin or other electrically insulative material. The resin 60 can serve as a underfill between the IC die 20 and the interposer 40 along the transverse direction 27 after the interposer 40 has been mounted to the IC die 20. In particular, the resin 60 can extend from the exposed region 33b of the passivation layer 32 to the first electrically insulative layer 48 of the interposer 40. Alternatively or additionally, the resin 60 can extend from the outer active surface 26 of the IC die substrate 24 adjacent the passivation layer 32 to the first electrically insulative layer 48 of the interposer 40. The resin 60 can further extend along a side surface of the IC die 20 that extends from the outer active surface away from the interposer 40, for instance along the transverse direction 27. It should be appreciated that the IC assembly 58 can define a wirebondable component. A wirebond can be mounted to the interposer 40, and can be further mounted to an external component such as an external substrate, thereby placing the interposer 40, and therefore the IC die 20, in electrical communication with the external component. It is appreciated that the interposer 40 can include a plurality of first holes 52, such that the interposer 40 is configured to be mounted to the IC die 20 at a plurality of electrically conductive interfaces 36 that extend into the first holes 52 as described above. The electrically conductive interfaces 36 can be mounted to different patterned structures of the electrically conductive layer 44 that are exposed through the first holes 52. The electrically conductive interfaces 36 can define a grid array of solder bumps in some examples. The interposer 40 can further include a plurality of second holes 54, such that the interposer 40 is configured to be mounted to a plurality of wirebonds 56 that are in electrical communication with respective ones of the electrically conductive interfaces 36. The wirebonds 56 are configured to be mounted to the different patterned structures of the electrically conductive layer 44 that is exposed through the plurality of second holes 54.

It should therefore be appreciated that a method is provided for converting a mounting interface of an IC die substrate 24, defined by the grid array, such as that defined by the flip chip IC die 20, to a wirebondable electrical component, such as that defined by a wirebondable IC die. Otherwise stated, the method can convert a grid array electrical interface of solder bumps to a wirebondable electrical interface. The method can include the step of mounting the interposer 40 to the IC die 20 in the manner described herein. In particular, the grid array interface on the flip chip IC die 20 is aligned with the first plurality of holes 52 in the first electrically insulative layer 48 of the interposer 40. The IC die, the interposer 40, and the electrically conductive interfaces 36 disposed between the IC die 20 and the interposer 40 can then be heated so that the electrically conductive interfaces 36 reflow and define an electrical and mechanical attachment between the interposer 40 and IC die 20. The second side 42b of the interposer 40 has the second plurality of holes 54 in the second electrically insulative layer 50 that expose wirebond pads in the electrically conductive layer 44. These exposed wirebond pads can define an attachment location for attachment of the wirebond 56.

Figure 4A:
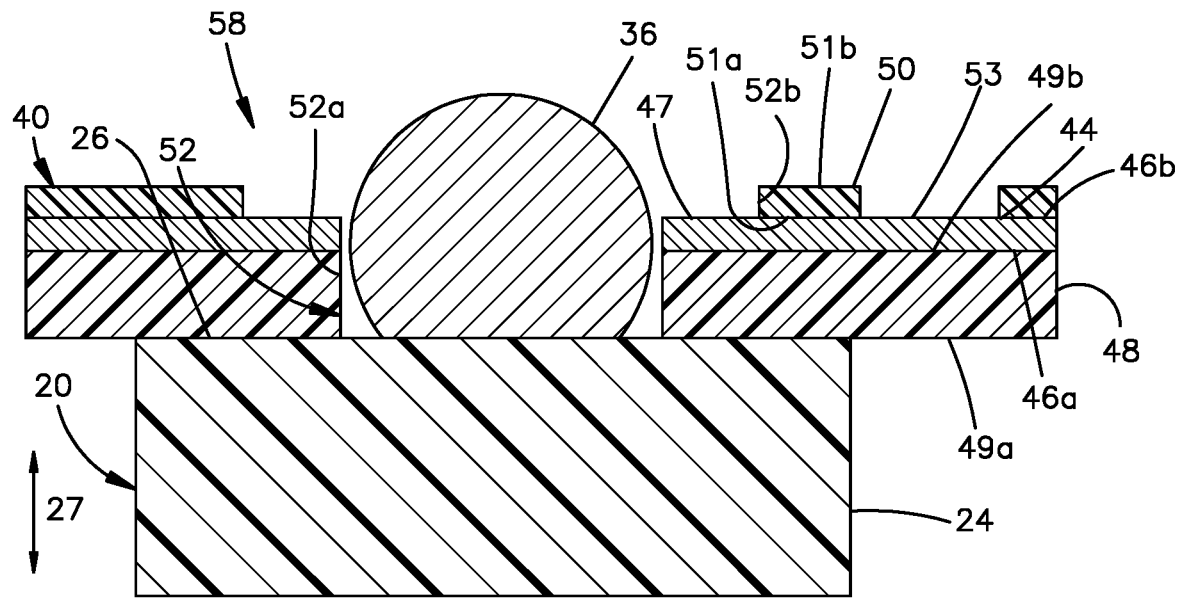
FIG. 4A is a cross-sectional view of yet another IC assembly including an interposer mounted to a flip chip IC die having a solder bump aligned with a through hole in an electrically conductive layer of the interposer.
Figure 4B:
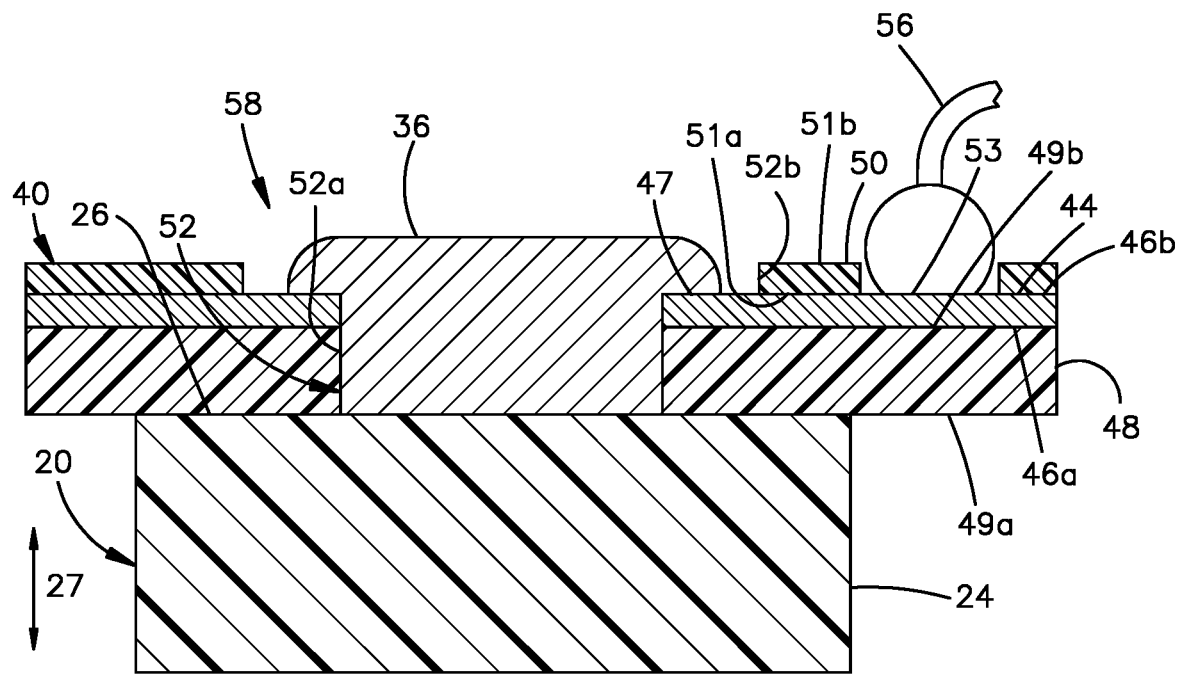
FIG. 4B is a cross-sectional view of the IC assembly of FIG. 4A, showing the solder bump reflowed in the through hole and in contact with the electrically conductive layer.

Referring now to FIG. 4A-4B, in another example, the first hole 52 can extend through the first electrically insulative layer 48 from the second surface 49b to the first surface 49a along the transverse direction 27 as described above, and can further extend through the electrically conductive layer 44 from the first surface 46a to the second surface 46b. The hole 52 can further extend through the second electrically insulative layer 50 from the first surface 51a to the second surface 51b. Further, the second electrically insulative layer 50 can be spaced from the first hole 52 along a direction perpendicular to the transverse direction 27, thereby exposing an exposed portion 47 of the second surface 46b of the electrically conductive layer 44. Thus, exposed portions 47 of the second surface 46b of the electrically conductive layer can be said to be exposed through a respective plurality of first holes 52 in the second electrically insulative layer. In this regard, a first portion 52a of the hole 52 that extends through the first electrically insulative layer 48 and the electrically conductive layer 44 can have a first cross-sectional dimension. The hole 52 defines a second portion 52b that extends through the second electrically insulative layer 50 can have a second cross-sectional dimension that is greater than the first cross-sectional dimension. The first and second cross-sectional dimensions can be measured in respective planes that are oriented perpendicular to the transverse direction 27. Further, one or both of the first and second cross-sectional dimensions can be defined by diameters in some example. At least a portion up to an entirety of the hole 52 at the second electrically insulative layer 50 can be outwardly spaced from the hole 52 at the electrically conductive layer 44.

Accordingly, when the electrically conductive interface 36 is melted during a reflow step, the material of the electrically conductive interface 36 can form an electrical and mechanical connection between the electrically conductive layer 44 and the IC die substrate 24. The first insulating layer 48 can define a mask for the material of the electrically conductive interface 36. Accordingly, during the reflow step, the electrically conductive interface 36 can extend through the first portion of the hole 52, and wet and bond to the second surface 46b of the electrically conductive layer 44.

While the IC die 20 can include various features on the active outer surface 26 in the manner described above, these features are not shown in FIGS. 4A-4B for the purposes of clarity and convenience.

It is recognized that the interposer 40 can be constructed in accordance with any suitable embodiment as desired. For instance, as illustrated in FIGS. 2-4B, the second or outer surface 51b of the second electrically insulative layer 50 can define an outer external surface of the interposer 40. In another example illustrated in FIG. 5, the interposer 40 can include first and second electrically conductive layers 62 and 64, respectively. The first electrically conductive layer 62 can be electrically connected to the IC die through the electrically conductive interfaces 36. The first electrically conductive layer 62 can be defined by the electrically conductive layer 44 in any manner as described above. The second electrically conductive layer 64 can be disposed on the second surface 51b of the electrically insulative layer 50. In particular, the second electrically conductive layer 64 can define a first or inner surface 65a that faces the second surface 51b of the second electrically insulative layer 50 and can attach to the second surface 51b of the second electrically insulative layer 50, and a second or outer surface 65b that is opposite the first surface 65a along the transverse direction 27. It should be appreciated that the second surface 65b is also opposite the first surface 46a of the first electrically conductive layer 62. In some examples, the first surface 65a can abut the second surface 51b of the electrically insulative layer 50.

Thus, the electrically insulative layer 50 can be disposed between the first and second electrically conductive layers 62 and 64 with respect to the transverse direction 27. Further, the respective footprints defined by the first and second electrically conductive layers can be aligned with each other along the transverse direction 27. The footprints extend along a plane that is perpendicular to the transverse direction 27. The second electrically conductive layer 64 can be made of a second metal or other suitable electrically conductive material. The second electrically conductive layer 64 can be the same material as the first electrically conductive layer 62 or a different material than the first electrically conductive layer 62. In some examples, the first and second layers 62 and 64 define first and second metal layers.

Either or both of the first and second electrically conductive layers 62 and 64 can be patterned as desired. Thus, the first electrically conductive layer 62 can include a plurality of discontinuous segments that are electrically isolated from each other. Similarly, the second electrically conductive layer 64 can include a plurality of discontinuous segments that are electrically isolated from each other. The second hole 54 extends through the second electrically insulative layer 50 to the first electrically conductive layer 62. Thus, a wirebond 56 can extend through the second hole 54 and can electrically connect to the first electrically conductive layer 62. The second electrically conductive layer 64 can define an electrical ground or electrical shield layer, or can route electrical signals as desired to and/or from the external substrate. If used as a ground layer, the second electrically conductive layer 64 may be a single continuous layer of electrically conductive metal. The layer 64 of conductive metal may have holes or gaps that allow electrical signals to be transmitted from or to the first electrically conductivly layer 62. If used to route electrical signals, the second electrically conductive layer 64 can be patterned as desired.

It is therefore appreciated that the electrically conductive interfaces 36 can be mounted to a first surface of at least one electrically conductive layer, and the wirebonds 56 can be mounted to a second surface of the at least one electrically conductive layer, wherein the second surface is opposite the first surface. The at least one electrically conductive layer, including the first and second surfaces, can be defined by the single electrically conductive layer 44 described above with respect to FIG. 2. Alternatively, the at least one electrically conductive layer can be defined by the first and second electrically conductive layers 62 and 64 that define the first and second surfaces 46a and 65b, respectively.

Figure 5:
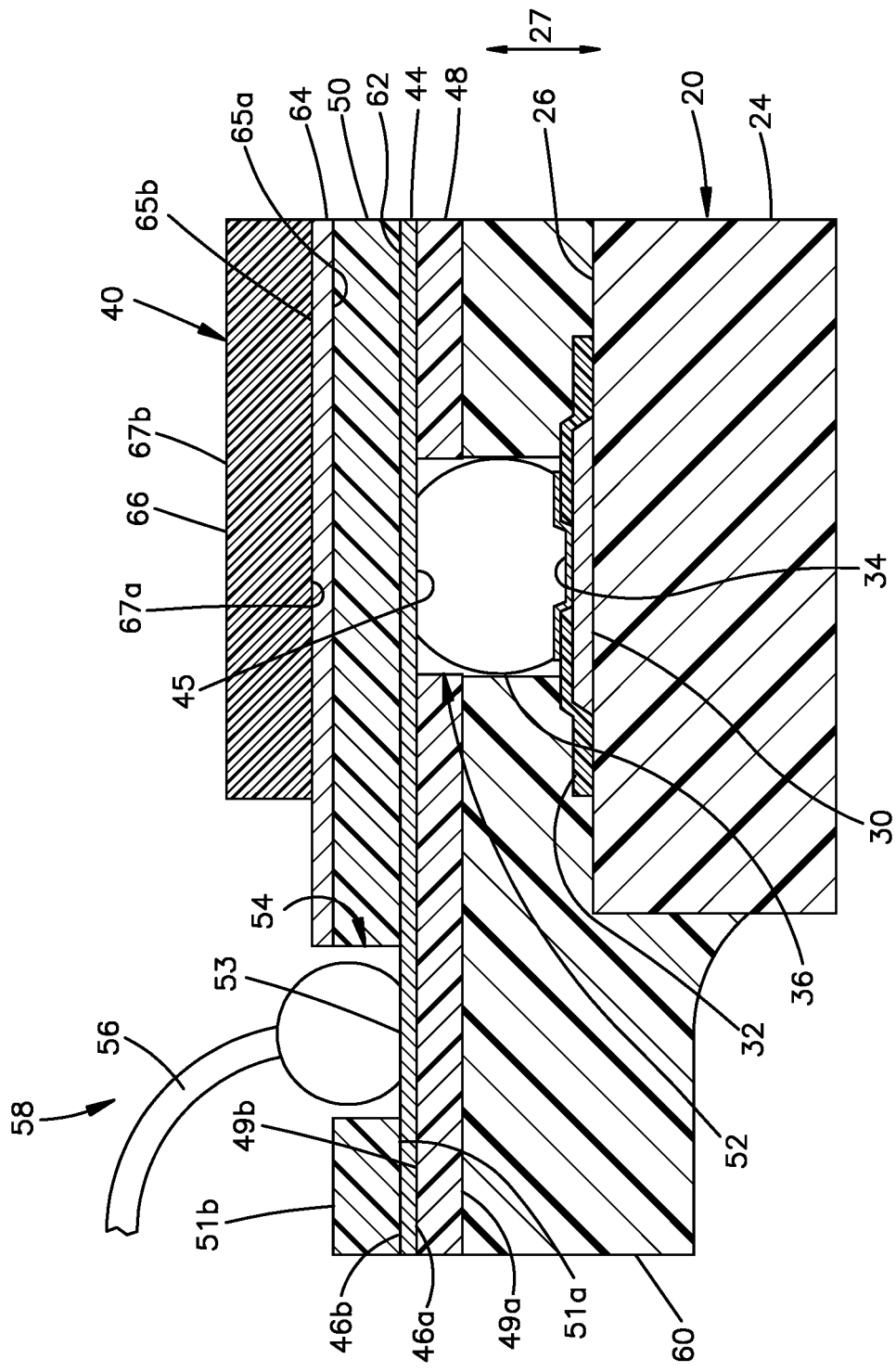
FIG. 5 is a cross-sectional view of another wirebondable IC assembly including a wirebondable interposer constructed in accordance with another example mounted to the flip chip IC die of FIG. 1.
Figure 6:
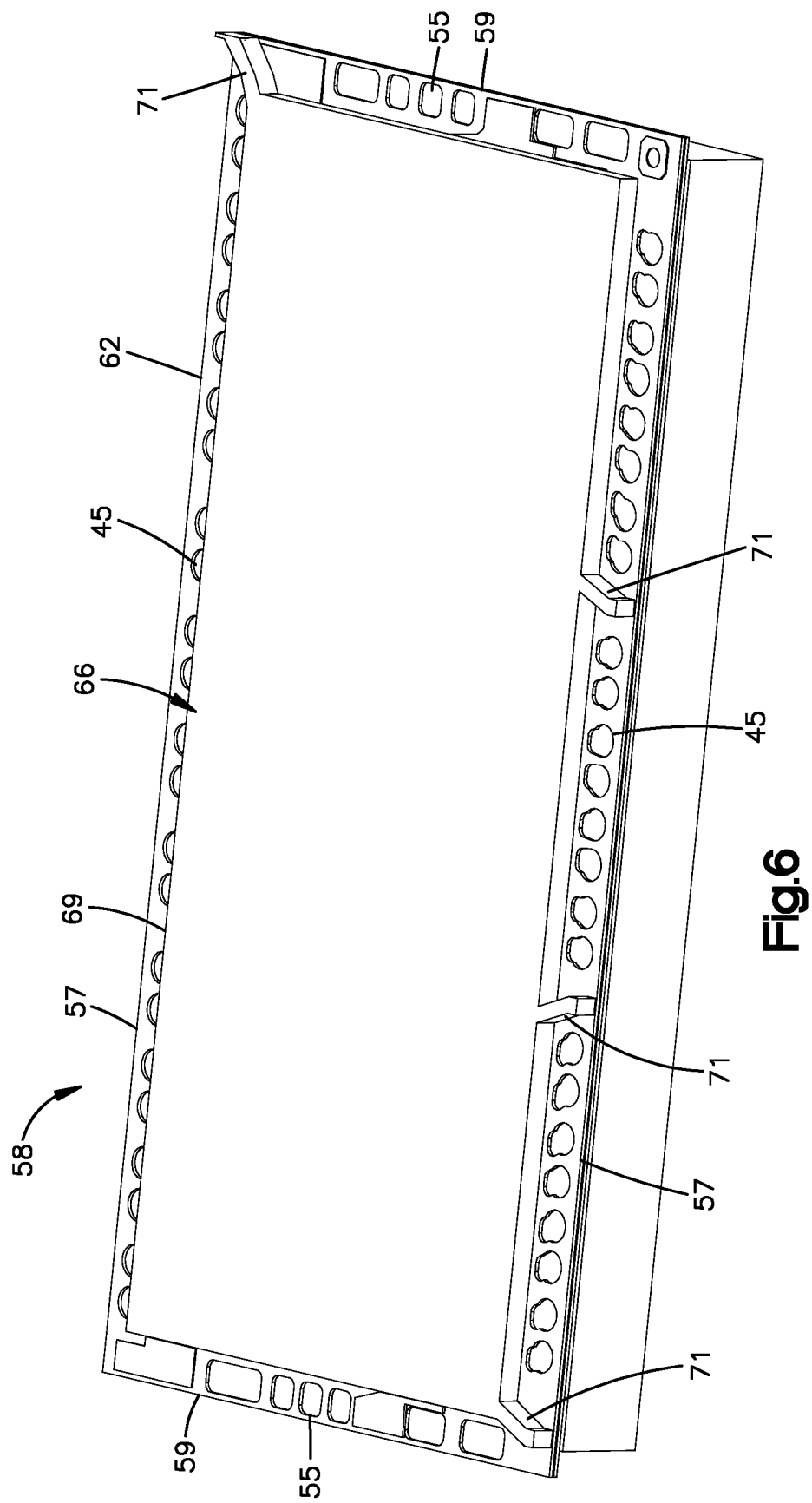
FIG. 6 is a perspective view of the wirebondable IC assembly illustrated in FIG. 5.

Additionally, referring to FIGS. 5-6, the interposer 40, and thus the wirebondable IC assembly 58, can include a stiffener 66 that is disposed on or otherwise supported by the second surface 65b of the second electrically conductive layer 64. The stiffener 66 defines a first or inner stiffener surface 67a that faces or abuts the second surface 65b of the second electrically conductive layer 64, and a second or outer stiffener surface 67b opposite the first stiffener surface 67a. The first stiffener surface 67a can attach to the second surface 65b of the second electrically conductive layer 64. Thus, the second electrically conductive layer 64 can be disposed between the stiffener 66 and the second electrically insulative layer 50 with respect to the transverse direction 27. The stiffener 66 can be made of any suitable material, such as glass, ceramic, organic laminates, polymers such as a polyimide, a liquid crystal polymer (LCP), or the like.

The stiffener 66 can define a stiffener body 69 that is be recessed from at least a portion of an outer perimeter of the second electrically conductive layer 64, so that the stiffener 66 does not interfere with wirebonds 56 that extend through the outer perimeter of the second electrically conductive layer 64, wherein the outer perimeter is defined in the plane that is oriented perpendicular to the transverse direction 27. In particular, at least a portion, up to an entirety, of an outer perimeter of the stiffener body 69 can be recessed with respect to at least a portion, up to an entirety, of the outer perimeter of the second electrically conductive layer 64. The stiffener 66 can further include at least one or more protrusions 71 that extend out from the outer perimeter of the stiffener body 66 in a direction generally perpendicular to the transverse direction 27. Further, the protrusions 71 can extend out from an outer surface of the outer perimeter of the stiffener body 66 in a direction generally perpendicular to the outer surface. At various locations along the perimeter of the stiffener one or protrusions may extend outward. The protrusions 71 can extend to the outer perimeter of the second electrically conductive layer 64. The protrusions 71 can allow the interposer 40 to be fabricated in a panel of interconnected interposers, which are then singulated by cutting the protrusions 71 that join adjacent interposers 40 of the panel of interconnected interposers.

In some examples, the stiffener 66 can define a hole that extends from the first stiffener surface 67a to the second stiffener surface 67b along the transverse direction 27. Thus, a wirebond can extend through the hole of the stiffener 66, through a second hole of the second electrically insulative layer 50 of the type described above, and to the electrically conductive layer 44. The hole of the stiffener 66, in combination with the second hole of the second electrically insulative layer 50, provides access to mount a wirebond to the electrically conductive layer 44 at a location spaced from the outer perimeter of the electrically conductive layer 44. The stiffener 66 can define the outermost layer of the interposer 40 with respect to the transverse direction 27. Thus, the second stiffener surface 67b can define the outermost surface of the interposer 40.

The stiffener 66 can have any suitable stiffener thickness along the transverse direction 27 from the first stiffener surface 67a to the second stiffener surface 67b. In one example, the stiffener thickness can be in a range from approximately 20 microns to approximately 150 microns, such as approximately 75 microns. It is appreciated that the stiffener 66 can have any suitable alternative thickness as desired. The first electrically conductive layer 62 can define a first thickness along the transverse direction 27 from the first surface 46a to the second surface 46b. Similarly, the second electrically conductive layer 64 can define a second thickness along the transverse direction 27 from the first surface 65a to the second surface 65b. The first and second thicknesses can be substantially equal to each other. Alternatively, the first and second thicknesses can be different than each other. In one example, the first and second thicknesses can be in a range from approximately 1 micron to approximately 25 microns. The first and second thicknesses can define any suitable alternative dimension as desired.

At least a portion of the interposer 40 can extend outward with respect to at least a portion of the outer perimeter of the IC die substrate 24 along at least one direction that is perpendicular to the transverse direction 27. For instance, the interposer 40 can extend outward with respect to an entirety of the outer perimeter of the IC die substrate 24 along all directions that are perpendicular to the transverse direction 27. Accordingly, the wirebond pads 53 can be disposed at a location that is outwardly spaced from the IC die substrate 24 along the at least one up to all directions that are perpendicular to the transverse direction 27. Otherwise stated, the IC die substrate 26 is not aligned with the wirebond pads 53 along the transverse direction 27. This reduces the risk of damaging the IC die substrate 24 during wirebonding.

The electrical contact pads 45 of the first electrically conductive layer 62 can be disposed along at least a portion up to an entirety of the outer perimeter of the interposer 40. The electrical contact pads 45 can extend along all sides of the interposer 40 or may be absent from one or more sides. As shown in FIG. 6, the electrical contact pads 45 of the first electrically conductive layer 62 can be disposed on all sides of the interposer 40 that define the outer perimeter of the interposer. Likewise, electrical contact pads 55 of the second electrically conductive layer 64 can be disposed on one or more sides of the interposer 40 along its perimeter. For instance, the interposer 40 can include first opposed sides 57 and second opposed sides 59 that extend between the first opposed sides 57. The first opposed sides 57 can have respective lengths that are longer than those of the second opposed sides 59. The sides 57 and 59 define the outer perimeter of the interposer 40.

In one example, the electrical contact pads 45 of the first electrically conductive layer 62 can be arranged along each of the sides of the first opposed sides 57. The electrical contact pads 55 of the second electrically conductive layer 64 can be arranged along each of the sides of the second opposed sides 59. Thus, it should be appreciated that one or more sides of the interposer 40 that at least partially define the outer perimeter of the interposer 40 can have only electrical contact pads 45 of the first electrically conductive layer 62, whereas one or more other sides of the interposer 40 that at least partially define the outer perimeter of the interposer 40 can include the electrical contact pads 55 of the second electrically conductive layer 64. Still one or more sides can include both the electrical contact pads 45 of the first electrically conductive layer 62 and electrical contact pads 55 of the second electrically conductive layer 64 in other examples. The electrical contact pads 45 can be referred to as first electrical contact pads, and the electrical contact pads 55 of the second electrically conductive layer 64 can be referred to as second electrical contact pads. The electrical contact pads arranged along a side of the interposer 40 can be aligned with each other along a straight line that extends parallel to the length of the side. In some examples, either or both of the electrical contact pads 45 of the first electrically conductive layer 62 and the electrical contact pads 55 of the second electrically conductive layer 64 can be disposed in the interior of the interposer 40 away from the outer perimeter of the interposer 40.

Figure 7:
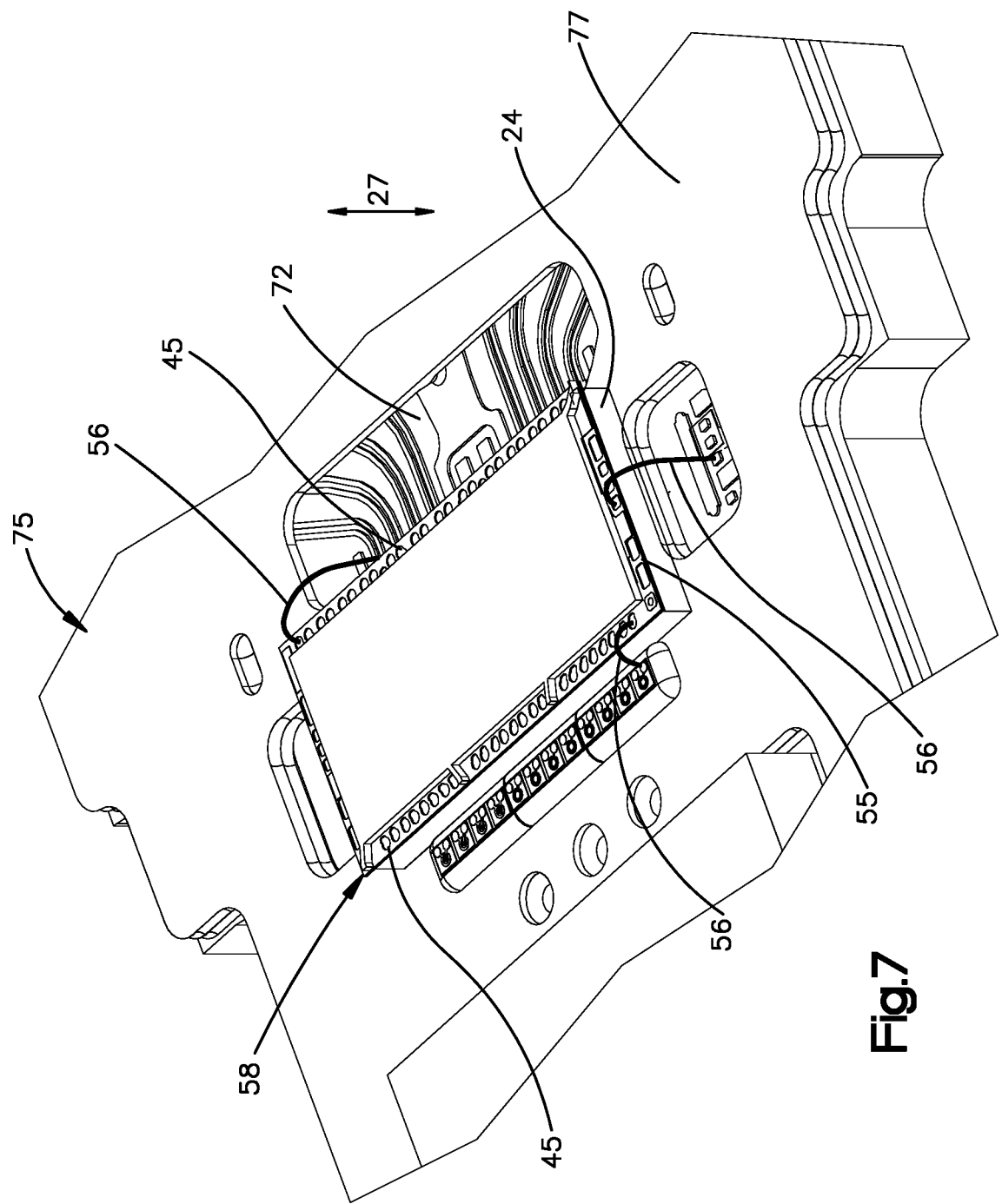
FIG. 7 is a perspective view of an optical transceiver including the IC assembly of FIG. 6.

Referring now to FIG. 7, and as described above, an optical transceiver 75 can include at least one wirebondable IC assembly 58. The optical transceiver 75 includes a host substrate 72 that is configured to transmit and receive high speed electrical signals (e.g., at the high data transfer speeds described above). The host substrate 72 can be configured as a printed circuit board (PCB). These high-speed signals may be electrically connected from one or more electrical contact pads on the host substrate 72 to a corresponding one or more electrical contact pad of the interposer 40 (such as one or more of the electrical contact pads 45). In this example, the host substrate 72 can define the external substrate described above. Similarly, high speed electrical signals may be communicated between an electrical contact pad on an optical-to-electrical (O/E) element or an electrical-to-optical (E/O) element and a contact pad of the interposer 40 (such as one or more of the electrical contact pads 45) using a wirebond 56. These wirebonds 56 can be disposed on opposed sides of the interposer 40 as shown in FIG. 7. It is recognized that during operation, most up to all of the contact pads 56 of the interposer 40 may have wirebond connections 56.

In some examples, it can be desirable for the wirebonds 56 that attach to the electrical contact pads 45 of the first electrically conductive layer 62 to be shorter in length than the wirebonds 56 that attach to the electrical contact pads 55 of the second electrically conductive layer 64. Accordingly, the wirebonds 56 that attach to the electrical contact pads 45 of the first electrically conductive layer 62 can be particularly suitable to transmit electrical signals at high speeds described herein greater than 10 gigabits per second, such as up to 56 gigabits per second. The wirebonds 56 that attach to the electrical contact pads 55 of the second layer 64 can be longer and thus configured to transmit power and/or control signals whose integrity is that less sensitive to the wirebond length compared to high speed electrical signals.

The high-speed electrical signals may be processed in the IC die substrate 24. An example of an E/O element is a VCSEL (Vertical Cavity Surface Emitting Laser), which takes an incoming high-speed electrical signal and outputs a modulated light beam. An example of an O/E element is a photodetector, which receives an incoming modulated light beam and outputs a modulated electrical signal. Wirebonds 56 can further establish control and power electrical connections between the interposer 40 and host substrate 72. The respective contact pads 45 that receive or transmit control and power electrical connections of the interposer 40 can be disposed on sides of the interposer 40 that are adjacent the sides of the interposer 40 having contact pads 45 that receive or transmit high speed electrical signals. The O/E and E/O elements and the IC die substrate 24 can be attached to a riser 77 that provides a heat transfer path to remove heat from these elements during operation. The IC die substrate 24 can be mounted such that the outer active surface 26 of the IC die substrate faces away from the riser and host substrate 72.

To maintain good signal integrity at high data transfer speeds, (such as exceeding 10 gigabits per second (Gbps), it can be desirable to minimize the length of the wirebond 56. In some examples, the wirebonds 56 can be less than approximately 2 mm, such as less than approximately 1 mm. It is recognized that the interposer 40 can have a small thickness along the transverse direction 27 can allow for short wirebond lengths. For instance, the interposer 40 can have a thickness along the transverse direction 27 that is in a range from 3 microns to 500 microns, for instance from approximately 50 microns to approximately 300 microns, including from approximately 100 microns to approximately 150 microns. In one particular example, the thickness of the interposer can be approximately 100 microns. In another particular example, the thickness of the interposer can be approximately 150 microns. It is recognized that these ranges of the interposer thickness are provided by way of example only, and that the interposer 40 can have any suitable alternative thickness as desired.

Figure 8A:
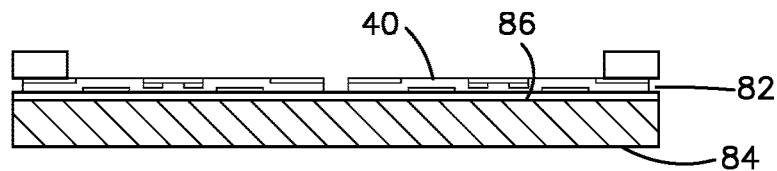
FIG. 8A shows a first step of a manufacturing process to produce a plurality of IC assemblies.

Referring now to FIGS. 8A-8F, a method is provided for fabricating at least one of the wirebondable IC assemblies 58, such as a plurality of the wirebondable IC assemblies 58. In one example, a plurality of wirebondable IC assemblies 58 can be produced simultaneously and in a cost effective manner. As illustrated in FIG. 8A, a plurality of interposers 40 can be formed on a single panel 82 and retained by a vacuum chuck 84. The panel 82 can contain as many interposers 40 as desired, within a range from 1 to approximately 100, such as approximately 70 interposers 40. As will now be described, a plurality of wirebondable IC die assemblies 58 equal in number to the interposers 40 of the panel 82 can be fabricated in parallel. Panels 82 with more than 100 individual interposers 40 are also envisioned.

Figure 8B:
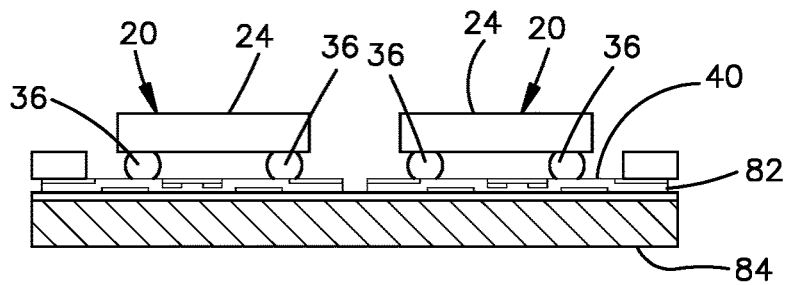
FIG. 8B shows a second step of a manufacturing process to produce a plurality of IC assemblies.
Figure 8C:
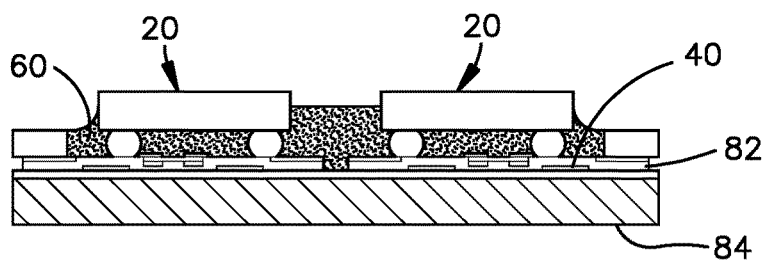
FIG. 8C shows a third step of a manufacturing process to produce a plurality of IC assemblies.
Figure 8D:
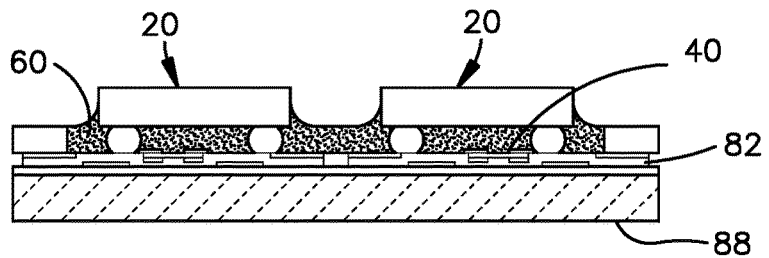
FIG. 8D shows a fourth step of a manufacturing process to produce a plurality of IC assemblies.
Figure 8E:
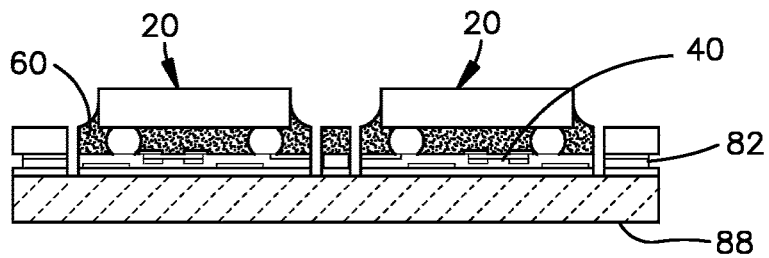
FIG. 8E shows a fifth step of a manufacturing process to produce a plurality of IC assemblies.
Figure 8F:
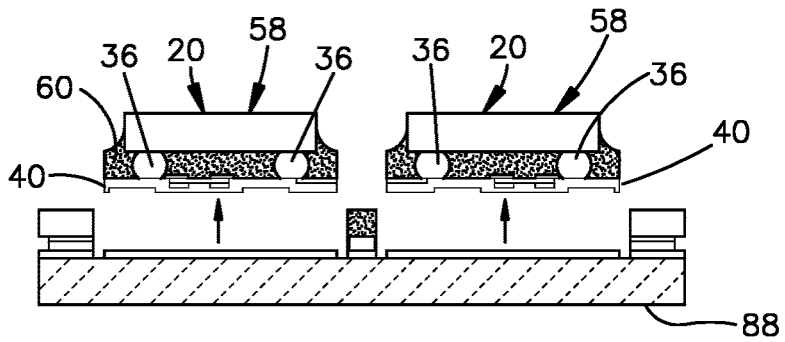
FIG. 8F shows a sixth step of a manufacturing process to produce a plurality of IC assemblies.

In particular, the vacuum chuck 84 can have a flat surface 86, and a vacuum can apply a force to the panel 82 that retains the interposers 40 and flattens the panel 82 of interposers 40. The vacuum chuck 84 can, for instance, be coupled to the outermost layer of the interposers 40, for instance at the outer surface of the outermost layer. As illustrated in FIG. 8B, a normal flip chip attachment process using reflow, such as solder reflow, can be made between the interposers 40 and a respective plurality of IC dies 20. Flux can be used to facilitate solder wetting. After attachment of the interposers 40 to the respective IC dies 20, a cleaning step can be performed that removes the flux from the wirebondable IC assembly 58. As illustrated in FIG. 8C, an underfill, which can be configured as the epoxy resin 60, can be injected into the gap between the IC die 20 and the interposer 40. The underfill can increase the mechanical robustness of the wirebondable IC die assembly 58. Referring now to FIG. 8D, the panel 82 of interposers 40 of the wirebondable IC die assembly 58 can be removed from the vacuum chuck 84, and mounted onto a backer layer 88. Thus, the backer layer 88 can be mounted to the outermost layer of the interposers 40, for instance at the outer surface of the outermost layer. The backer 88 can be configured as a glass backer having an ultraviolet (UV) light release bonding agent on an attachment surface to which the panel 82 of interposers 40 are bonded. As illustrated in FIG. 8E, a singulation step can dice the panel 82 of interposers 40 into a plurality of singulated interposers 40 that are separated from each other. The singulated interposers 40 remain supported by the backer layer 88. Referring to FIG. 8F, the backer layer 88 can be exposed to UV light, which can release the individual and singulated wirebondable IC die assemblies 58 from the backer layer 88. Thus, the wirebondable IC die assemblies 58 can be subsequently easily removed from the backer layer 88.

Referring now to FIG. 9, while examples have been described above as having a single IC die 20 electrically connected to an interposer 40 to define the wirebondable IC assembly 58, it is recognized that the wirebondable IC assembly 58 can include multiple flip chip IC dies 20 that are electrically connected to a single interposer 40. For instance, a first IC die 20*a*, a second IC die 20*b*, and a third IC die 20*c* can be mounted to a single interposer 40. The IC dies 20*a*-20*c* can be attached to the interposer 40 as described above, but the reflow step can mount and secure all three dies IC 20*a*-20*c* to the interposer 40. It is appreciated that the electrical interfaces 36 and the wirebond pads 53 described above are not shown in FIG. 9, as they are hidden from view.

In order to conserve valuable real estate on a substrate that accepts the interposer 40, it can be desirable to limit the footprint of the interposer 40 to only slightly larger than the footprint of the IC die 20 along respective planes that are perpendicular to the transverse direction 27. In some examples, the footprint of the interposer 40 is no more than approximately twice the size of the footprint of the one or more IC dies 20 that are flip-chip mounted to the interposer. For instance, in some examples, the footprint of the interposer 40 is no greater than approximately 50% larger than the footprint of the one or more IC dies 20 that are flip-chip mounted to the interposer 40. In still other examples, the footprint of the interposer 40 is no more than 20% greater than the footprint of the one or more IC dies 20 that are flip-chip mounted to the interposer 40. The footprints can refer to a two-dimensional outline or a size of a major surface of the element in a plane that is oriented perpendicular to the transverse direction 27.

Figure 10:
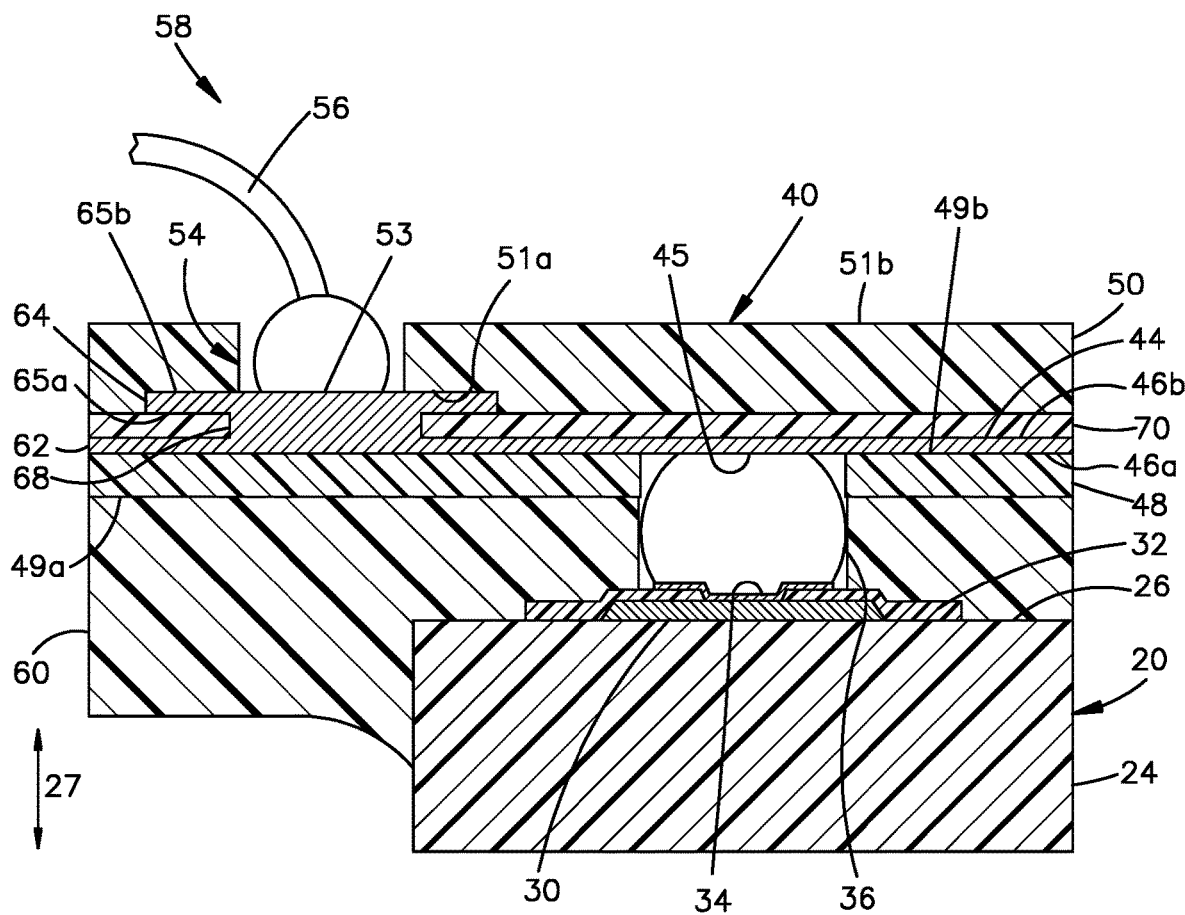
FIG. 10 is a cross-sectional view of still another wirebondable IC assembly including a wirebondable interposer constructed in accordance with still another example mounted to the flip chip IC die of FIG. 1.

While the interposer 40 has been described above in accordance with certain examples, it is appreciated that the interposer 40 can be constructed in accordance with any suitable example as desired. For instance, referring now to FIG. 10, in another example, it is recognized that the first and second electrically conductive layers 62 and 64 can be placed in electrical communication with each other in accordance with any suitable alternative examples as desired. For instance, the interposer 40, and thus the wirebondable IC assembly 58, can include at least one or more electrically conductive through vias 68 that place the first and second electrically conductive layers 62 and 64 in electrical communication with each other.

The second electrically insulative layer 50 can be disposed on or otherwise supported by the second electrically conductive layer 64 instead of the stiffener 66 or in addition to the stiffener 66 (see FIG. 5). The second electrically insulative layer 50 can be disposed on or otherwise supported by the second surface 65*b* of the second electrically conductive layer 64. For instance, the second electrically insulative layer 50 can extend along the second surface 65*b*, and can further extend over a portion of the second surface 65*b* of the second electrically conductive layer 64. The second electrically insulative layer 50 can define the outermost layer of the interposer 40 with respect to the transverse direction 27. The second electrically insulative layer 50 can further define the second holes 54 that extend from the first surface 51*a* to the second surface 51*b* along the transverse direction 27, thereby exposing the second electrically conductive layer 64, and in particular the second surface 65*b* of the second electrically conductive layer. Accordingly, the second electrically insulative layer 50 can expose the second electrically conductive surface of the at least one electrically conductive layer. Thus, exposed portions of the second conductive layer 64 can be said to be exposed through a respective plurality of second holes 54 in the second electrically insulative layer 50.

The interposer 40 can include a third electrically insulative layer 70 that extends between the first electrically conductive layer 62 and the second electrically conductive layer 64. Further, the third electrically insulative layer 70 can attach to the first and second electrically conductive layers 62 and 64. The third electrically insulative layer 70 can further extend between the first electrically conductive layer 62 and the second electrically insulative layer 50, and can attach to the first electrically conductive layer 62 and the second electrically insulative layer 50. Thus, the first surface 65*a* of the second electrically conductive layer 64 and the second surface 46*b* of the first electrically conductive layer 62 can face and attach to the third electrically insulative layer 70. In particular, a first surface of the third electrically insulative layer 70 can face the first electrically conductive layer 62, and a second surface of the third electrically insulative layer 70 can face the second electrically conductive layer 64. Thus, the third electrically insulative layer 70 can electrically isolate the first electrically conductive layer 62 from the second electrically conductive layer 64. The electrically conductive vias 68 can extend through the third electrically insulative layer 70 from the first electrically conductive layer 62 to the second electrically conductive layer 64. At least a portion up to all of the each at least one electrically conductive via 68 can be oriented along the transverse direction 27. The electrically conductive vias 68 can mate to each of the first and second electrically conductive layers 62 and 64, respectively, thereby establishing an electrical connection between the first electrically conductive layer 62 and the second electrically conductive layer 64.

The first and second electrically conductive layers 62 and 64 can be patterned, and unwanted material of the first and second electrically conductive layers 62 and 64 can be etched away with the third electrically insulative layer 70 disposed between the first and second electrically conductive layers 62 and 64 with respect to the transverse direction 27. The third electrically insulative material can be configured as a polyimide or any suitable alternative electrically insulative material as desired The first and second electrically insulative layers 48 and 50 can each be a liquid photoimageable (LPI) solder mask that is conformable to the first and second electrically conductive layers 62 and 64, respectively, after the first and second electrically conductive layers 62 and 64 have been patterned. In particular, the first and second electrically insulative layers 48 and 50 can be applied to the first and second electrically conductive layers 62 and 64, respectively, after the first and second electrically conductive layers 62 and 64 have been patterned. Thus, at locations where material of the first electrically conductive layer 62 has been etched away, the first and third electrically insulative layers 48 and 70 can contact each other. Similarly, at locations where material of the second electrically conductive layer 64 has been etched away, the second and third electrically insulative layers 50 and 70 can contact each other.

Patterned portions of the first electrically conductive layer 62 are in electrical communication with a respective pattern portion of the second electrically conductive layer 64 through one or more electrically conductive vias 68, and are electrically isolated from other patterned portions of the second electrically conductive layer 64 by the third electrically insulative layer 70. The patterned portions of the first electrically conductive layer 62 can further be electrically isolated from each other by the first electrically insulative layer 48. Conversely, patterned portions of the second electrically conductive layer 64 are in electrical communication with a respective pattern portion of the first electrically conductive layer 62 through a via 68, and electrically isolated from other patterned portions of the first electrically conductive layer 62 by the third electrically insulative layer 70. The patterned portions of the second electrically conductive layer 64 can further be electrically isolated from each other by the second electrically insulative layer 50.

The interposer 40, and thus the wirebondable IC assembly 58, can include any number of vias 68 as desired. The vias can be spaced from each other along any suitable center-to-center pitch as desired. The pitch can be defined along any suitable direction perpendicular to the transverse direction 27. The pitch can be in a range from approximately 200 microns to approximately 500 microns as desired. In one example, the pitch can be approximately 300 microns, thereby providing a relatively small footprint of the wirebondable IC assembly 58 in a plane that is oriented perpendicular to the transverse direction 27. The wirebond 56 can thus be mounted to the second electrically conductive layer 64, such that the wirebond 56 is in electrical communication with the first electrically conductive layer 62 through the via 68. Thus, the second electrically conductive layer 64 can define one or more wirebond pads 53.

Figure 11A:
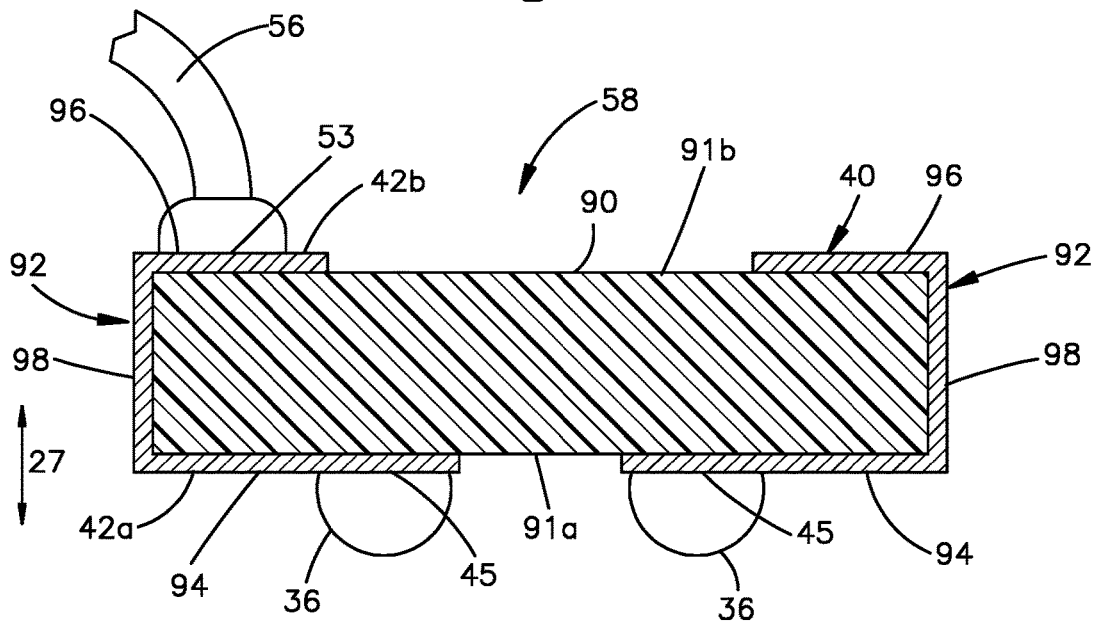
FIG. 11A is a cross-sectional view of an alternative embodiment of an interposer having a wrap-around electrically conductive layer.

As described above, the respective layers of the interposer 40 can be substantially planar along respective planes that are oriented perpendicular to the transverse direction 27. However, in yet another example illustrated in FIG. 11A, the interposer 40 constructed in accordance with another example can include an electrically insulative layer 90 that defines a first or inner surface 91*a* that faces the IC die 20, and a second or outer surface 91*b* opposite the inner surface 91*a* along the transverse direction 27. The interposer 40 can further include at least one electrically conductive structure 92 that extends along each of the first surface 91*a* and the second surface 91*b*. For instance, the at least one electrically conductive structure 92 can include a first electrically conductive layer 94 that extends along at least a portion of the first surface 91*a*, and a second electrically conductive layer 96 that extends along at least a portion of the second surface 91*b*. The electrically insulative layer 90 can thus be disposed between the first and second electrically conductive layers 94 and 96 along the transverse direction 27. Further, the electrically insulative layer 90 can be attached to each of the first and second electrically conductive layers 94 and 96, respectively. The first and second electrically conductive layers 94 and 96 can be patterned in the manner described above, as desired.

The interposer 40 can further include a third electrically conductive layer 98 can extends along an exterior side surface 94 of the electrically insulative layer 90 that extends from the first surface 91*a* to the second surface 91*b*. The third electrically conductive layer 98 can extend from the first electrically conductive structure 92 and the second electrically conductive layer 94. Thus, the third electrically conductive layer 98 can be oriented perpendicular to each of the first and second electrically conductive layers 94 and 96. The third electrically conductive layer 98 can be patterned as described above, such that patterned portions of the third electrically conductive layer 98 place respective pattered portions of the first electrically conductive layer 94 in electrical communication with respective patterned portions of the second electrically conductive layer 94. Either or both of the first and second electrically conductive layers 94 and 96 can define through holes so as to expose respective portions of the first and second surfaces 91a and 91b of the electrically insulative layer 90.

The first electrically conductive layer 94 can define or support the contact pad 45, and the second electrically conductive layer 96 can define one or more wirebond pads 53. The first, second, and third electrically conductive layers 94, 96, and 98 can be defined by the same material, such as a metal, and can be monolithic with each other. Alternatively, one or more up to all of the first, second, and third electrically conductive layers 94, 96, and 98 can be made of different materials. Alternatively or additionally, one or more up to all of the first, second, and third electrically conductive layers 94, 96, and 98 can define separate layers that are in electrical communication with each other. It should be appreciated that the at least one electrically conductive layer described above can be at least partially defined by the first and second electrically conductive layers 94 and 96, alone or in combination with the third electrically conductive layer 98.

The at least one electrically conductive structure 92 can thus be said to wrap around the electrically insulative layer 90. The electrically conductive interface 36 can be placed between the first electrically conductive layer 94 and the flip chip IC die in the manner described above, and reflowed to mount the interposer 40 to the IC die. Thus, the first electrically conductive layer 94 can be disposed at the first side 42a of the interposer 40. A wirebond 56 can be mounted to the second electrically conductive layer 96, thereby placing the wirebond 56 in electrical communication with the electrically conductive interface 36. Thus, the second electrically conductive layer 96 can be disposed at the second side 42b of the interposer 40. It should therefore be appreciated that the interposer 40 can place a wirebond 56 in electrical communication with a flip chip die 20 without fabricating or otherwise providing holes that extend through the electrically insulative layer 90. In other words, instead of the electrical connection between the electrically conductive interface 36 and the wirebond 56 (or between the contact pad 45 and wirebond pad 53) extending through an electrically insulative layer in the manner described above, the electrical connection between the electrically conductive interface 36 and the wirebond 56 (or between the contact pad 45 and wirebond pad 53) can extend around the electrically insulative layer 90. In both examples, the electrical connection extends from a first side of an electrically insulative layer to a second side of an electrically insulative layer.

Figure 11B:
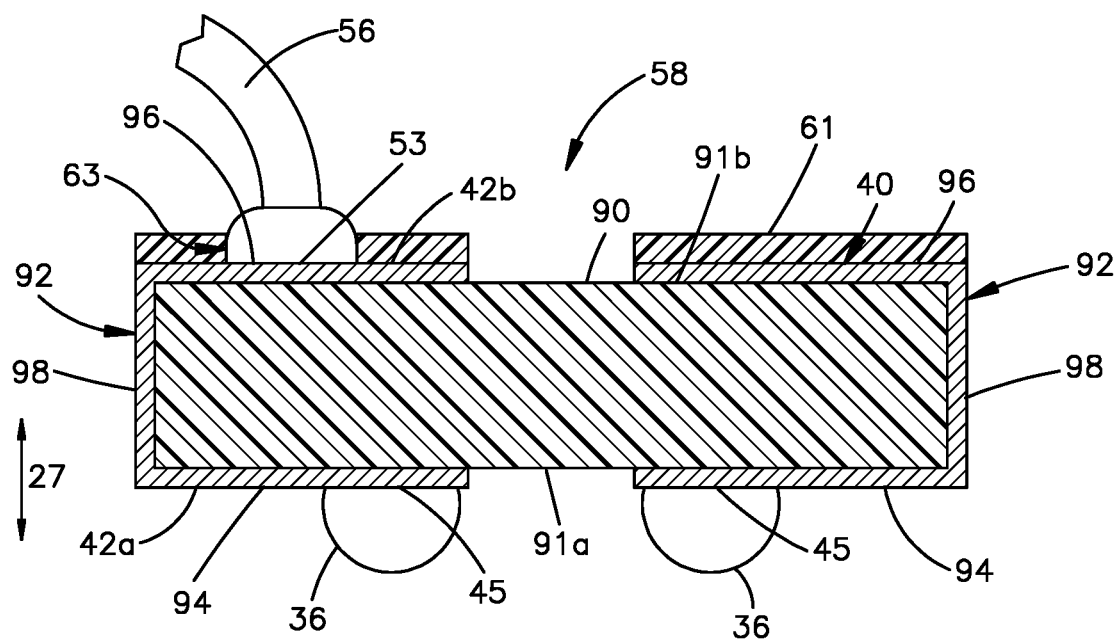
FIG. 11B is a cross-sectional view of the interposer illustrated in FIG. 11A, but including a second electrically insulative layer in another example.

As described above, each of the first electrically conductive layer 94 and the second electrically conductive layer 96 can be patterned as desired. Each of the first and second electrically conductive layers 94 and 96 can define single access layers. That is, electrical connections defined by the electrically conductive interface 36 and the wirebond 56 are only made to a first side and a second side of the first electrically conductive layer 94 and the second electrically conductive layer 96, respectively. The respective first and second sides of the first and second electrically conductive layers 94 and 96 can face away from the electrically insulative layer 90 and from each other. Having the first and second electrically conductive layers 94 and 96 each being a single access metal layer, may in some situations be advantageous as compared to a single metal layer with double access. For example, it may be easier to source a two metal layer laminate as compared to a single metal layer laminate. Bonding agents or protective films for the laminates may also be more readily available for a two metal layer laminate. As described above, the interposer 40 can include a plurality of electrically conductive structures 92 that place respective electrically conductive wirebond pads 53 in electrical communication with respective electrical contact pads 45, and thus wirebonds 56 that are mounted to the wirebond pads 53 in electrical communication with electrical interfaces 36 that are mounted to the electrical contact pads 45, respectively. The electrically conductive structures can be electrically isolated from each other by the electrically insulative layer 90. As illustrated in FIG. 11B, the interposer 40 can include a second electrically insulating layer 61 that is attached to the second electrically conductive layer 96 on a second side of the second electrically conductive layer 46 side that is opposite a first side of the second electrically conductive layer 96 that faces the electrically insulative layer 90, which can be referred to as a first electrically insulative layer. The second insulating layer 61 can define through holes 63 that expose the wirebond pads 53 on the second electrically conductive layer 96.

It should be appreciated that the illustrations and descriptions of the examples shown in the figures are for exemplary purposes only and should not be construed as limiting the disclosure. One skilled in the art will appreciate that the present disclosure contemplates various embodiments. For example, the stiffener may be used as a mounting surface for additional components, such as a heat sink or some other electrical component. Terms such as above and below are relative to the orientation of the various elements described in the figures and need not describe the orientation of the element in a final product. Additionally, it should be understood that the concepts described above with the above-described embodiments may be employed alone or in combination with any of the other embodiments described above. It should further be appreciated that the various alternative embodiments described above with respect to one illustrated embodiment can apply to all embodiments as described herein, unless otherwise indicated.

What is claimed:

1. A method of converting an IC die to a wirebondable electrical component, the method comprising the step of flip chip mounting the IC die to a first surface of at least one patterned electrically conductive layer of an interposer, wherein the interposer has wirebond pads at a second surface of the at least one patterned electrically conductive layer that is opposite the first surface along a transverse direction, the first surface abuts an electrically insulative surface of a first electrically insulative layer, and the second surface abuts an electrically insulative surface of a second electrically insulative layer that is spaced from the first electrically insulative layer along the transverse direction, and wherein the IC die has an active surface, and the active surface faces away from an external substrate when the wirebondable electrical component is wirebonded to the external substrate, wherein the step of flip chip mounting comprises reflowing a plurality of solder bumps on the IC die to the first surface of the at least one patterned electrically conductive layer, and wherein the first surface of the at least one patterned electrically conductive layer is exposed through first holes that extend through the first electrically insulative layer at a first side of the interposer, and the interposer has second holes in the second electrically insulative layer that expose the wirebond pads at the second surface of the at least one patterned electrically conductive layer, and wherein the second electrically insulative layer extends continuously and uninterrupted along the second surface of the at least one patterned electrically conductive layer with the exception of the second holes.

2. The method of claim 1, further comprising the step of mounting wirebonds to the second surface of the at least one patterned electrically conductive layer through the second holes.

3. The method of claim 1, wherein the at least one patterned electrically conductive layer is defined by a single electrically conductive layer that defines each of the first surface and the second surface of the at least one patterned electrically conductive layer.

4. The method of claim 1, wherein the first surface of the at least one patterned electrically conductive layer is defined by a first electrically conductive layer, and the second surface is defined by a second electrically conductive layer.

5. The method of claim 4, wherein the second electrically insulative layer defines a first surface that faces toward the IC die and an opposed second surface, and the second electrically conductive layer abuts the first surface of the second electrically insulative layer.

6. The method of claim 5, wherein the second electrically conductive layer further abuts a third electrically insulative layer that is disposed between the first electrically insulative layer and the second electrically insulative layer along the transverse direction.

7. A method of claim 4, wherein the interposer includes a third electrically insulative layer disposed between the first and second electrically conductive layers.

8. A method of claim 7, wherein the interposer further includes a plurality of vias electrically connecting the first electrically conductive layer to the second electrically conductive layer.

9. The method of claim 8, wherein the vias extend through the third electrically insulative layer.

10. The method of claim 9, wherein the first electrically conductive layer includes patterned portions that are in electrical communication with a respective patterned portion of the second electrically conductive layer through a respective one of the vias, and the patterned portions of the first electrically conductive layer are electrically isolated from other patterned portions of the second electrically conductive layer by the third electrically insulative layer.

11. The method of claim 9, wherein the second electrically conductive layer includes patterned portions that are in electrical communication with a respective patterned portion of the first electrically conductive layer through a respective one of the vias, and the patterned portions of the second electrically conductive layer are electrically isolated from other patterned portions of the first electrically conductive layer by the third electrically insulative layer.

12. The method of claim 1 wherein the IC die is a singulated IC die cut from a wafer containing a plurality of IC dies.

13. The method of claim 1, wherein the interposer comprises an organic laminate.

14. The method of claim 1, wherein the external substrate comprises a host substrate of an optical transceiver.

15. A wirebondable IC die assembly comprising:
an IC die configured for flip chip mounting;
an interposer having a first electrically insulative layer, a second electrically insulative layer, a first patterned electrically conductive layer disposed between the first and second electrically insulative layers, and a second patterned electrically conductive layer;
wherein the IC die is flip chip mounted to the first patterned electrically conductive layer at a first side of the interposer through solder that extends through holes of the first electrically insulative layer,
wherein the second insulating layer has holes that extend through the second patterned electrically conductive layer to define an outer perimeter of the second patterned electrically conductive layer and expose wirebond pads at the first patterned electrically conductive layer, such that wirebonds mounted to the wirebond pads are configured to extend through the outer perimeter of the second patterned electrically conductive layer and out a second side of the interposer that is opposite the first side, and
wherein the wirebondable IC die assembly further comprises a stiffener disposed on the second patterned electrically conductive layer, and the stiffener is recessed from at least a portion of the outer perimeter of the second patterned electrically conductive layer.

16. The wirebondable IC die assembly of claim 15, wherein the first and second sides are opposite each other along a transverse direction, and a footprint of the interposer is less than twice a size of a footprint of the IC die, wherein the footprints extend along respective planes that are oriented perpendicular to the transverse direction.

17. The wirebondable IC die assembly of claim 16, wherein the footprint of the interposer is less than 50% larger than the footprint of the IC die.

18. The wirebondable IC die assembly of claim 16, wherein the footprint of the interposer is less than 20% larger than the footprint of the IC die.

19. The wirebondable IC die assembly of claim 15, further comprising a plurality of IC dies that are mounted to the first patterned electrically conductive layer.

20. An optical transceiver comprising:
the wirebondable IC die assembly of claim 15;
an external substrate; and
a wirebond that places the wirebondable IC die assembly in electrical communication with the external substrate.

21. The optical transceiver of claim 20, wherein the IC die has active circuitry formed on an outer active surface of the IC die, and the outer active surface faces away from the external substrate.

22. The wirebondable IC die assembly of claim 15, wherein the second electrically insulative layer is disposed between the first and second patterned electrically conductive layers along a transverse direction, and the outer perimeter of the second electrically conductive layer is defined in a plane that is oriented perpendicular to the transverse direction.

23. The wirebondable IC die assembly of claim 15, wherein the solder extends from the IC die to the first surface of the first patterned electrically conductive layer.

* * * * *